(12) United States Patent
Nam et al.

(10) Patent No.: US 11,737,273 B2
(45) Date of Patent: Aug. 22, 2023

(54) THREE-DIMENSIONAL SEMICONDUCTOR MEMORY DEVICES

(71) Applicant: Samsung Electronics Co., Ltd., Suwon-si (KR)

(72) Inventors: Seungwoo Nam, Seoul (KR); Byoungil Lee, Hwaseong-si (KR); Yujin Seo, Daejeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 322 days.

(21) Appl. No.: 17/146,564

(22) Filed: Jan. 12, 2021

(65) Prior Publication Data

US 2021/0296359 A1    Sep. 23, 2021

(30) Foreign Application Priority Data

Mar. 18, 2020    (KR) .................. 10-2020-0033416

(51) Int. Cl.
| | |
|---|---|
| *H01L 27/11582* | (2017.01) |
| *H10B 43/27* | (2023.01) |
| *H01L 23/522* | (2006.01) |
| *H10B 41/10* | (2023.01) |
| *H10B 41/27* | (2023.01) |
| *H10B 41/40* | (2023.01) |
| *H10B 43/10* | (2023.01) |
| *H10B 43/40* | (2023.01) |

(52) U.S. Cl.
CPC ......... *H10B 43/27* (2023.02); *H01L 23/5226* (2013.01); *H10B 41/10* (2023.02); *H10B 41/27* (2023.02); *H10B 41/40* (2023.02); *H10B 43/10* (2023.02); *H10B 43/40* (2023.02)

(58) Field of Classification Search
CPC ............................... H10B 43/27; H10B 43/20
See application file for complete search history.

(56) References Cited

U.S. PATENT DOCUMENTS

| | | |
|---|---|---|
| 8,564,050 B2 | 10/2013 | Park et al. |
| 10,163,924 B2 | 12/2018 | Ahn |
| 10,211,222 B1 | 2/2019 | Yamanaka |

(Continued)

FOREIGN PATENT DOCUMENTS

KR    10-2021-0103255 A    8/2021

*Primary Examiner* — Christopher A Johnson
(74) *Attorney, Agent, or Firm* — Myers Bigel, P.A.

(57) ABSTRACT

3D semiconductor memory devices may include a horizontal structure that may be on an upper surface of a substrate and may include first and second horizontal patterns sequentially stacked on the upper surface of the substrate, a stack structure including electrodes stacked on the horizontal structure, a vertical pattern extending through the electrodes and connected to the first horizontal pattern, and a separation structure intersecting the stack structure and the horizontal structure and protruding into the upper surface of the substrate. A lowermost electrode may have first inner sidewalls facing each other with the separation structure interposed therebetween. The second horizontal pattern may have second inner sidewalls facing each other with the separation structure interposed therebetween. A maximum distance between the first inner sidewalls in the first direction may be less than a maximum distance between the second inner sidewalls in the first direction.

20 Claims, 35 Drawing Sheets

AA

(56) References Cited

U.S. PATENT DOCUMENTS

| | | |
|---|---|---|
| 10,263,010 B2 | 4/2019 | Choi et al. |
| 2015/0380428 A1 | 12/2015 | Matsuda |
| 2018/0374869 A1* | 12/2018 | Kim .................... H01L 29/0847 |
| 2019/0081065 A1 | 3/2019 | Lee |
| 2019/0244970 A1* | 8/2019 | Jung ...................... H10B 43/35 |
| 2019/0333931 A1* | 10/2019 | Jung ................. H01L 29/40114 |

* cited by examiner

THREE-DIMENSIONAL SEMICONDUCTOR MEMORY DEVICES

CROSS-REFERENCE TO RELATED APPLICATION

This U.S. non-provisional patent application claims priority under 35 U.S.C. § 119 to Korean Patent Application No. 10-2020-0033416, filed on Mar. 18, 2020, in the Korean Intellectual Property Office, the disclosure of which is hereby incorporated by reference in its entirety.

BACKGROUND

Embodiments of the inventive concepts relate to three-dimensional (3D) semiconductor memory devices and, more particularly, to 3D semiconductor memory devices with improved reliability and integration density.

Semiconductor devices have been highly integrated to provide excellent performance and low manufacturing costs. The integration density of semiconductor devices may directly affect the costs of the semiconductor devices, thereby increasing demand for highly integrated semiconductor devices. The integration density of two-dimensional (2D) or planar semiconductor devices may be mainly determined by an area where a unit memory cell occupies. Therefore, the integration density of the 2D or planar semiconductor devices may be greatly affected by a technique of forming fine patterns. However, since extremely high-priced apparatuses may be used to form fine patterns, increases in the integration density of 2D semiconductor devices may be limited. Thus, three-dimensional (3D) semiconductor memory devices have been developed to overcome the above limitations. 3D semiconductor memory devices may include memory cells three-dimensionally arranged.

SUMMARY

Embodiments of the inventive concepts may provide three-dimensional (3D) semiconductor memory devices capable of improving reliability and integration density.

According to some embodiments of the inventive concepts, 3D semiconductor memory devices may include a horizontal structure that may be on an upper surface of a substrate and may include a first horizontal pattern and a second horizontal pattern that may be sequentially stacked on the upper surface of the substrate in a vertical direction, a stack structure including a plurality of electrodes stacked on the horizontal structure in the vertical direction, a vertical pattern extending through the plurality of electrodes and connected to the first horizontal pattern, and a separation structure intersecting the stack structure and the horizontal structure and protruding into the upper surface of the substrate. A lowermost electrode of the plurality of electrodes may have first inner sidewalls that may face each other and may be spaced apart from each other in a first direction with the separation structure interposed therebetween, and the second horizontal pattern may have second inner sidewalls that may face each other and may be spaced apart from each other in the first direction with the separation structure interposed therebetween. A maximum distance between the first inner sidewalls in the first direction may be less than a maximum distance between the second inner sidewalls in the first direction.

According to some embodiments of the inventive concepts, 3D semiconductor memory devices may include a substrate including a recess in an upper surface thereof, a stack structure including a plurality of electrodes stacked on the upper surface of the substrate in a vertical direction, a horizontal structure that may be between the stack structure and the substrate and may include a first horizontal pattern and a second horizontal pattern that may be sequentially stacked on the upper surface of the substrate in the vertical direction, and a separation structure intersecting the stack structure and the horizontal structure in a first direction parallel to the upper surface of the substrate. A portion of the separation structure may be in the recess of the substrate. The first horizontal pattern may have first inner sidewalls that may face each other and may be spaced apart from each other in a second direction that may be perpendicular to the first direction with the separation structure interposed therebetween. A maximum width of the recess in the second direction may be greater than a maximum distance between the first inner sidewalls in the second direction.

According to some embodiments of the inventive concepts, 3D semiconductor memory devices may include peripheral logic circuits on a lower substrate, a lower insulating layer on the peripheral logic circuits, a substrate on the lower insulating layer and including a recess in an upper surface thereof, a stack structure including a plurality of electrodes vertically stacked on the upper surface of the substrate, a horizontal structure that may be between the stack structure and the substrate and may include a first horizontal pattern and a second horizontal pattern that may be sequentially stacked on the upper surface of the substrate, a vertical pattern extending through the plurality of electrodes and connected to the first horizontal pattern, a separation structure intersecting the stack structure and the horizontal structure in a first direction parallel to the upper surface of the substrate and including a portion in the recess of the substrate, an interface layer between the first horizontal pattern and the second horizontal pattern, and a first insulating layer between the substrate and the separation structure in the recess. The interface layer may extend on a first portion of a top surface of the first horizontal pattern, and the first insulating layer may extend on a second portion of the upper surface of the first horizontal pattern.

According to some embodiments of the inventive concepts, 3D semiconductor memory devices may include a substrate including a first recess and a second recess that may be in an upper surface of the substrate and may be spaced apart from each other in a first direction, a stack structure including a plurality of electrodes stacked on the upper surface of the substrate in a vertical direction, a horizontal structure that may be between the stack structure and the substrate and may include a first horizontal pattern and a second horizontal pattern that may be sequentially stacked on the upper surface of the substrate in the vertical direction, a vertical pattern extending through the plurality of electrodes and connected to the first horizontal pattern, a first separation structure extending through the stack structure and the horizontal structure in the vertical direction and including a portion in the first recess, and a second separation structure extending through the stack structure and the horizontal structure in the vertical direction and including a portion in the second recess. The first separation structure and the second separation structure may have different maximum widths in the first direction at respective levels, in the vertical direction, that are lower than the upper surface of the substrate.

BRIEF DESCRIPTION OF THE DRAWINGS

The inventive concepts will become more apparent in view of the attached drawings and accompanying detailed description.

DETAILED DESCRIPTION OF THE EMBODIMENTS

Example embodiments of the inventive concepts will be described hereinafter in detail with reference to the accompanying drawings.

Figure 1:
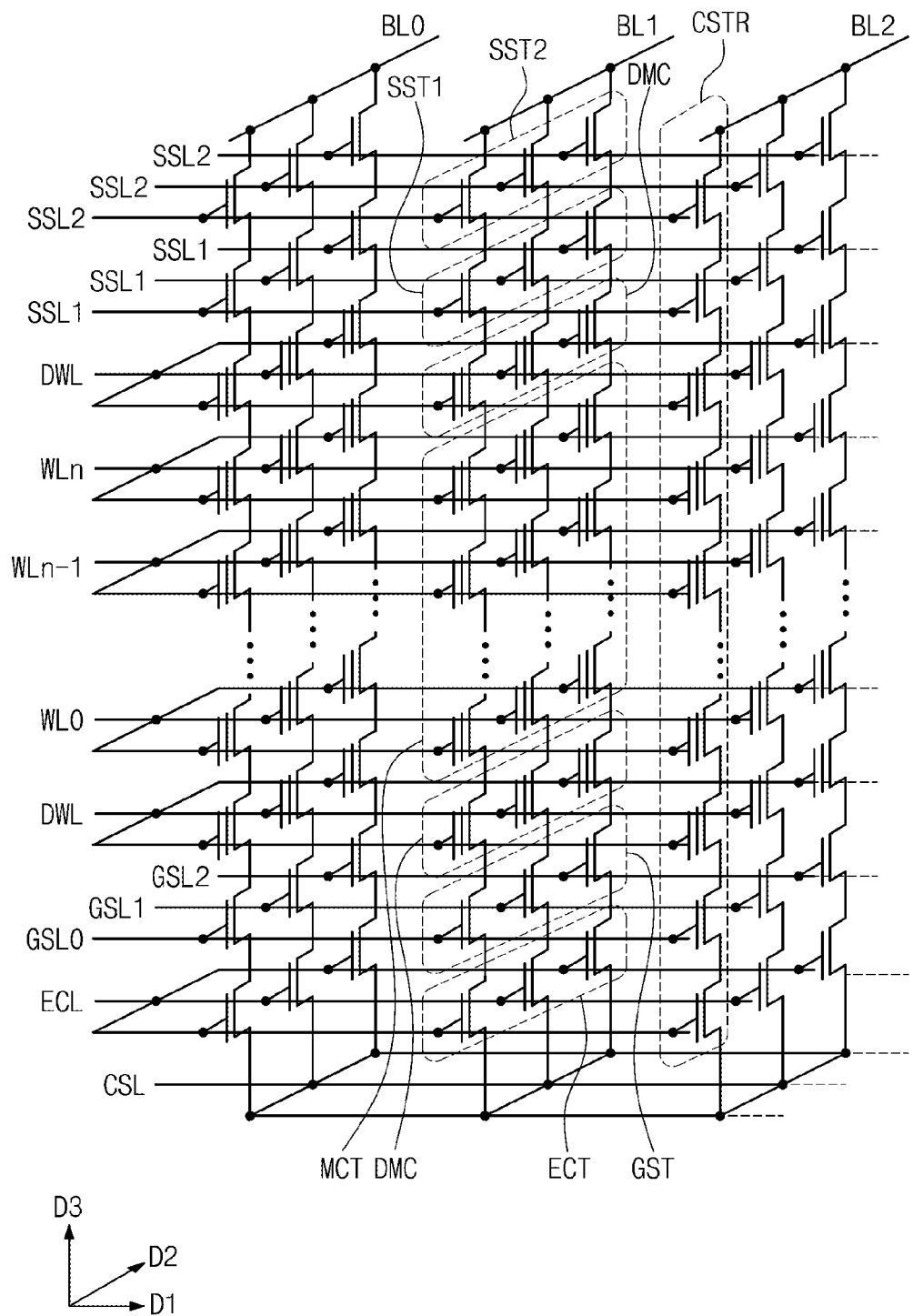
FIG. 1 is a schematic circuit diagram illustrating a cell array of a three-dimensional (3D) semiconductor memory device according to some embodiments of the inventive concepts.

FIG. 1 is a schematic circuit diagram illustrating a cell array of a three-dimensional (3D) semiconductor memory device according to some embodiments of the inventive concepts.

Referring to FIG. 1, a cell array of a 3D semiconductor memory device may include a common source line CSL, a plurality of bit lines BL0 to BL2, and a plurality of cell strings CSTR provided between the common source line CSL and the bit lines BL0 to BL2.

The cell strings CSTR may be two-dimensionally arranged along first and second directions D1 and D2 and may extend in a third direction D3. The bit lines BL0 to BL2 may be spaced apart from each other in the first direction D1 and may extend in the second direction D2. As used herein, "an element A extends in a direction X" (or similar language) may mean that the element A extends longitudinally in the direction X.

A plurality of the cell strings CSTR may be connected in parallel to each of the bit lines BL0 to BL2. The cell strings CSTR may be connected in common to the common source line CSL. In other words, a plurality of the cell strings CSTR may be disposed between a single common source line CSL and the plurality of bit lines BL0 to BL2. The common source line CSL may be provided in plurality, and the plurality of common source lines CSL may be two-dimensionally arranged. In some embodiments, the same voltage may be applied to the plurality of common source lines CSL. In some embodiments, the common source lines CSL may be electrically controlled independently of each other. As used herein, "an element A is connected to an element B" (or similar language) may mean that the element A is electrically and or physically connected to the element B. The term "and/or" includes any and all combinations of one or more of the associated listed items.

In some embodiments, each of the cell strings CSTR may include string selection transistors SST1 and SST2 connected in series to each other, memory cell transistors MCT connected in series to each other, a ground selection transistor GST, and an erase control transistor ECT. Each of the memory cell transistors MCT may include a data storage element.

In some embodiments, each of the cell strings CSTR may include first and second string selection transistors SST1 and SST2 connected in series to each other, and the second string selection transistor SST2 may be connected to one of the bit lines BL0 to BL2. In some embodiments, each of the cell strings CSTR may include a single string selection transistor. In some embodiments, in each of the cell strings CSTR, the ground selection transistor GST may include a plurality of MOS transistors connected in series to each other, like the first and second string selection transistors SST1 and SST2.

Each of the cell strings CSTR may include a plurality of the memory cell transistors MCT respectively disposed at different distances from the common source line CSL. The memory cell transistors MCT may be connected in series between the first string selection transistor SST1 and the ground selection transistor GST. The erase control transistor ECT may be connected between the ground selection transistor GST and the common source line CSL. In addition, each of the cell strings CSTR may further include dummy cell transistors DMC which are connected between the first string selection transistor SST1 and an uppermost one of the memory cell transistors MCT and between the ground selection transistor GST and a lowermost one of the memory cell transistors MCT, respectively.

In some embodiments, the first string selection transistor SST1 may be controlled by a first string selection line SSL1, and the second string selection transistor SST2 may be controlled by a second string selection line SSL2. The memory cell transistors MCT may be controlled by word lines WL0 to WLn, respectively, and the dummy cell transistors DMC may be controlled by dummy word lines DWL, respectively. The ground selection transistor GST may be controlled by a ground selection line GSL0, GSL1 or GSL2, and the erase control transistor ECT may be controlled by an erase control line ECL. The common source line CSL may be connected in common to sources of the erase control transistors ECT.

Gate electrodes of the memory cell transistors MCT (or the dummy cell transistors DMC) disposed at substantially the same level (or distance) from the common source line CSL may be connected in common to one of the word lines WL0 to WLn and DWL so as to be in an equipotential state. In some embodiments, even though the gate electrodes of the memory cell transistors MCT are disposed at substantially the same level from the common source line CSL, the gate electrodes disposed in one row (or one column) may be controlled independently of the gate electrodes disposed in another row (or another column).

The ground selection lines GSL0 to GSL2 and the string selection lines SSL1 and SSL2 may extend in the first direction D1 and may be spaced apart from each other in the second direction D2. The ground selection lines GSL0 to GSL2 disposed at substantially the same level from the common source line CSL may be electrically isolated from each other, and the string selection lines SSL1 or SSL2 disposed at substantially the same level from the common source line CSL may be electrically isolated from each other. In addition, the erase control transistors ECT of the cell strings CSTR different from each other may be controlled in common by the erase control line ECL. The erase control transistors ECT may generate a gate induced drain leakage (GIDL) in an erase operation of the cell array. According to some embodiments, in the erase operation of the cell array, an erase voltage may be applied to the bit line and/or the common source line CSL, and the GIDL current may be generated from the string selection transistor SST2 and/or the erase control transistor ECT.

Figure 2:
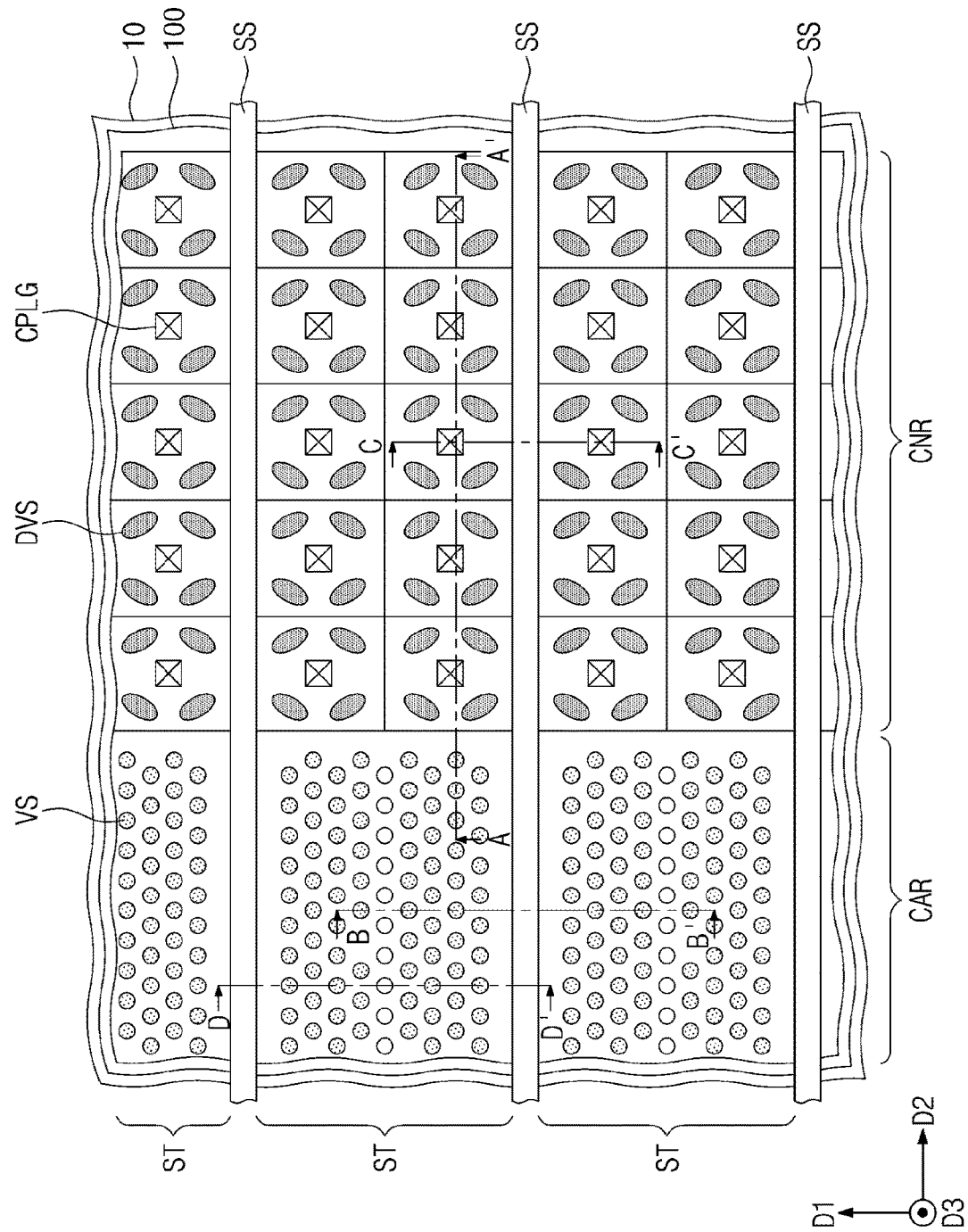
FIG. 2 is a plan view illustrating a 3D semiconductor memory device according to some embodiments of the inventive concepts.
Figure 3A:
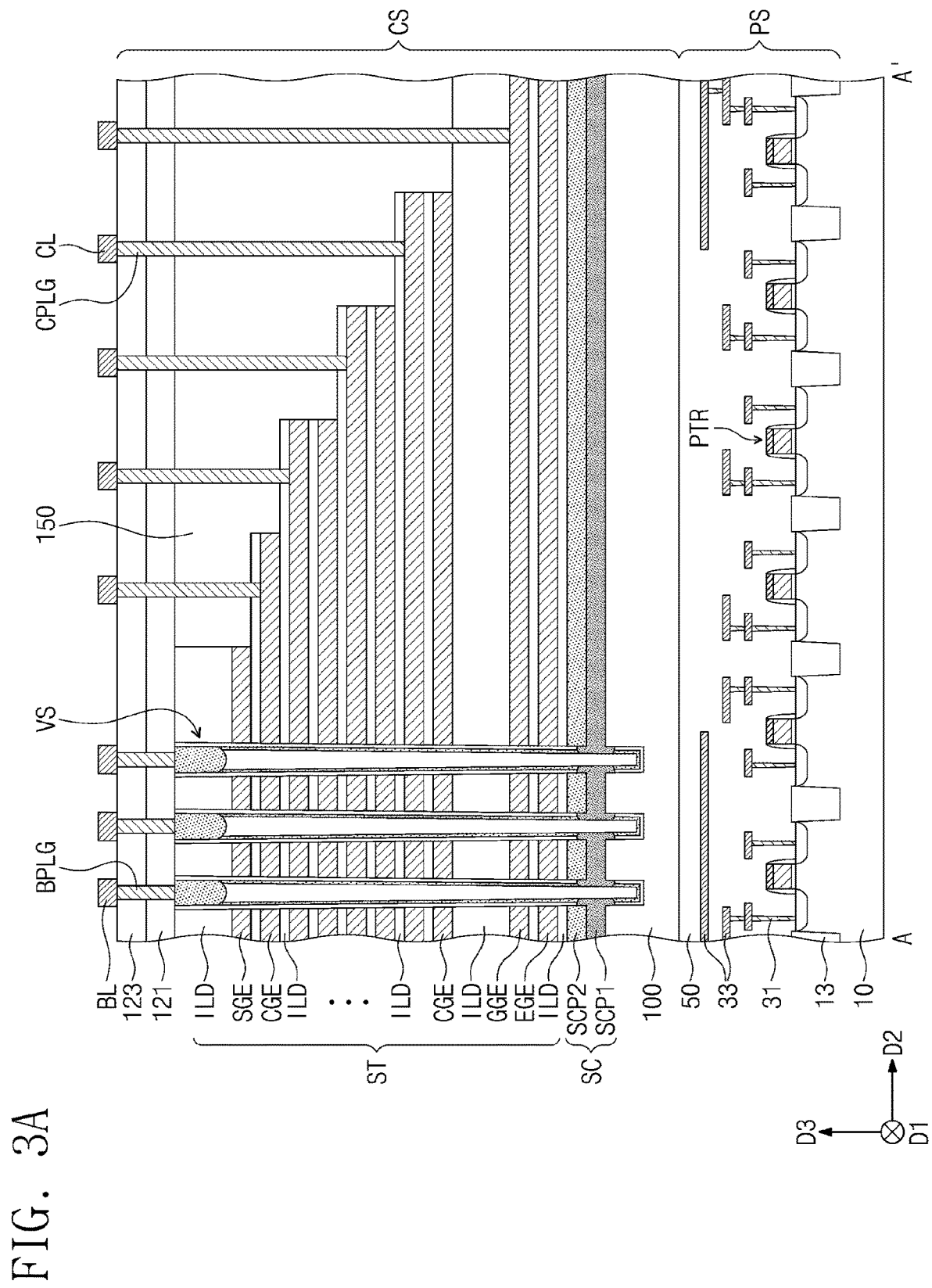
FIGS. 3A, 3B and 3C are cross-sectional views taken along lines A-A', B-B' and C-C' of FIG. 2, respectively, to illustrate a 3D semiconductor memory device according to some embodiments of the inventive concepts.
Figure 3B:
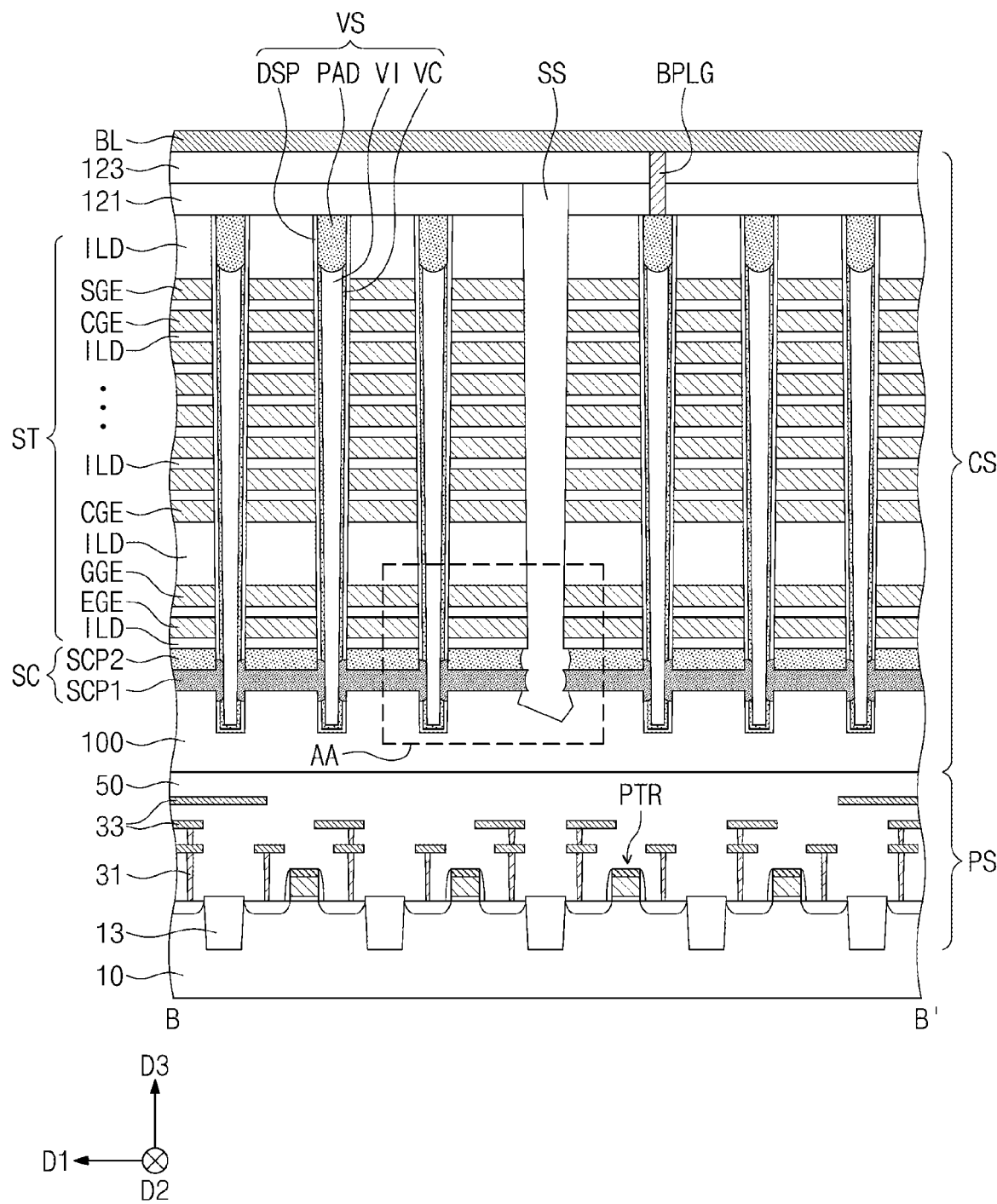
Figure 3C:
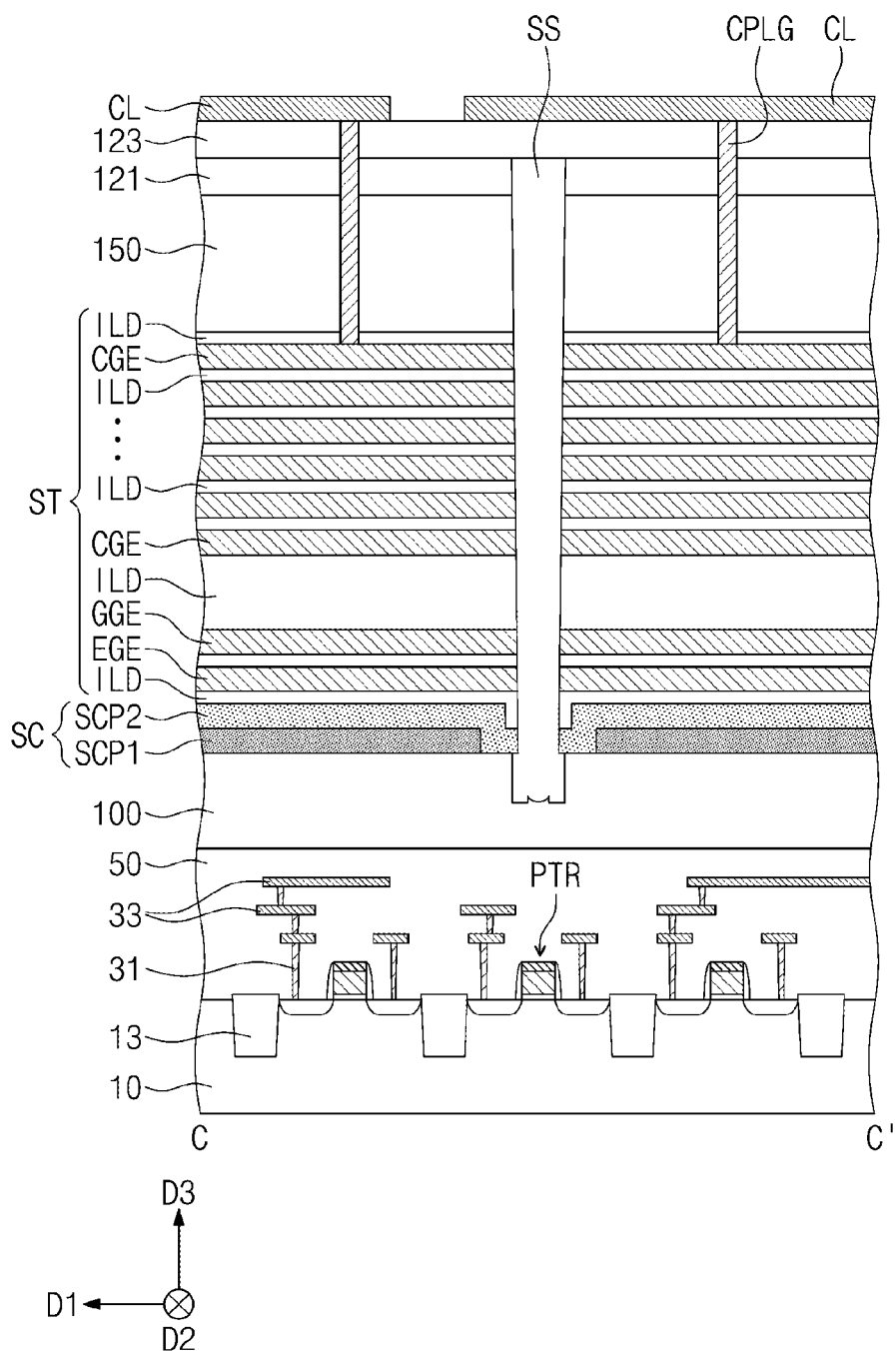

FIG. 2 is a plan view illustrating a 3D semiconductor memory device according to some embodiments of the inventive concepts. FIGS. 3A, 3B and 3C are cross-sectional views taken along lines A-A', B-B' and C-C' of FIG. 2, respectively, to illustrate a 3D semiconductor memory device according to some embodiments of the inventive concepts. FIGS. 4A to 4E are enlarged views of a portion 'AA' of FIG. 3B. FIGS. 5A and 5B are enlarged cross-sectional views of a portion 'BB' of FIG. 4A.

Referring to FIGS. 2 and 3A to 3C, a 3D semiconductor memory device according to some embodiments may include a peripheral logic structure PS and a cell array structure CS disposed on the peripheral logic structure PS.

The peripheral logic structure PS may include peripheral logic circuits PTR integrated on a lower substrate 10 and a lower insulating layer 50 covering the peripheral logic circuits PTR. "An element A covering an element B" (or similar language) as used herein means that the element A is on the element B but does not necessarily mean that the element A covers the element B entirely.

The lower substrate 10 may include a silicon substrate, a silicon-germanium substrate, a germanium substrate, or a single-crystalline epitaxial layer grown on a single-crystalline silicon substrate. The lower substrate 10 may include active regions defined by a device isolation layer 13.

The peripheral logic circuits PTR may be disposed on the active regions. The peripheral logic circuits PTR may include row and column decoders, a page buffer, and/or a control circuit. More particularly, the peripheral logic circuits PTR may include a peripheral gate insulating layer on the lower substrate 10, a peripheral gate electrode on the peripheral gate insulating layer, and source/drain regions disposed in the active region at both sides of the peripheral gate electrode.

Peripheral circuit interconnection lines 33 may be electrically connected to the peripheral logic circuits PTR through peripheral contact plugs 31. For example, the peripheral contact plugs 31 and the peripheral circuit interconnection lines 33 may be connected to NMOS and PMOS transistors.

The lower insulating layer 50 may be provided on an entire top surface of the lower substrate 10. The lower insulating layer 50 may cover the peripheral logic circuits PTR, the peripheral contact plugs 31, and the peripheral circuit interconnection lines 33 on the lower substrate 10. The lower insulating layer 50 may include a plurality of stacked insulating layers. For example, the lower insulating layer 50 may include at least one of a silicon oxide layer, a silicon nitride layer, a silicon oxynitride layer, or a low-k dielectric layer.

The cell array structure CS may be disposed on the lower insulating layer 50. The cell array structure CS may include a horizontal semiconductor layer 100, a horizontal structure SC, stack structures ST, and vertical structures VS. In some embodiments, the cell strings CSTR illustrated in FIG. 1 may be integrated on the horizontal semiconductor layer 100. The stack structures ST and the vertical structures VS may constitute the cell strings CSTR illustrated in FIG. 1. The horizontal semiconductor layer 100 may be referred to as a substrate.

More particularly, the horizontal semiconductor layer 100 may be disposed on a top surface of the lower insulating layer 50. The horizontal semiconductor layer 100 may be formed of a semiconductor material. For example, the horizontal semiconductor layer 100 may include at least one of silicon (Si), germanium (Ge), silicon-germanium (SiGe), gallium-arsenic (GaAs), indium-gallium-arsenic (InGaAs), or aluminum-gallium-arsenic (AlGaAs). The horizontal semiconductor layer 100 may include a semiconductor material doped with dopants of a first conductivity type (e.g., an N-type) and/or an intrinsic semiconductor material not doped with dopants. The horizontal semiconductor layer 100 may have a crystal structure including at least one of a single-crystalline structure, an amorphous structure, or a poly-crystalline structure.

The horizontal structure SC may be disposed between the stack structure ST and the horizontal semiconductor layer 100. The horizontal structure SC may be parallel to the top surface of the horizontal semiconductor layer 100 and may extend in the first direction D1 and the second direction D2 in parallel to the stack structure ST. The horizontal structure SC may be the common source line CSL described with reference to FIG. 1. The horizontal structure SC may include a first horizontal pattern SCP1 and a second horizontal pattern SCP2 on the first horizontal pattern SCP1. The first and second horizontal patterns SCP1 and SCP2 may be sequentially stacked on the horizontal semiconductor layer 100. The first and second horizontal patterns SCP1 and SCP2 may be formed of a semiconductor material doped with dopants having the first conductivity type, e.g., phosphorus (P) or arsenic (As). In some embodiments, each of the first and second horizontal patterns SCP1 and SCP2 may be formed of a semiconductor material doped with N-type dopants, and a concentration of the N-type dopants in the first horizontal pattern SCP1 may be greater than a concentration of the N-type dopants in the second horizontal pattern SCP2.

The stack structure ST may be disposed on the horizontal semiconductor layer 100. The stack structure ST may be spaced apart from the horizontal semiconductor layer 100 with the horizontal structure SC interposed therebetween. The horizontal semiconductor layer 100 may have the top surface extending in the first direction D1 and the second direction D2 perpendicular to the first direction D1. The horizontal semiconductor layer 100 may include a cell array region CAR and a connection region CNR, which are arranged in the second direction D2. The stack structure ST may extend from the cell array region CAR onto the connection region CNR in the second direction D2 and may have a staircase structure on the connection region CNR. The stack structure ST may include electrodes EGE, GGE, CGE and SGE stacked in the third direction D3 (e.g., a vertical direction) perpendicular to the first and second directions D1 and D2. Lengths of the electrodes of the stack structure ST in the second direction D2 may sequentially decrease as a vertical distance from the lower substrate 10 increases, and a height of the stack structure ST may decrease as a horizontal distance from the cell array region CAR increases. Each of the electrodes may have a pad portion on the connection region CNR, and the pad portions of the electrodes may be located at positions horizontally and vertically different from each other.

In some embodiments, the electrodes EGE, GGE, CGE and SGE may include an erase control gate electrode EGE adjacent to the horizontal structure SC, a ground selection gate electrode GGE on the erase control gate electrode EGE, a plurality of cell gate electrodes CGE sequentially stacked on the ground selection gate electrode GGE, and a string selection gate electrode SGE on an uppermost one of the cell gate electrodes CGE.

The erase control gate electrode EGE may be adjacent to the horizontal structure SC and may be used as gate electrodes of the erase control transistors ECT (see FIG. 1) for controlling an erase operation of a memory cell array. The erase control gate electrode EGE may be used as the gate electrodes of the erase control transistors ECT (see FIG. 1) which are used to generate the gate induced drain leakage (GIDL). The ground selection gate electrode GGE may be used as gate electrodes of the ground selection transistors GST (see FIG. 1) for controlling electrical connection between the common source line CSL (see FIG. 1) and vertical patterns VC of the vertical structures VS. The cell gate electrodes CGE may be used as control gate electrodes WL0 to WLn and DWL (see FIG. 1) of the memory and dummy cell transistors MCT and DMC (see FIG. 1). The string selection gate electrode SGE corresponding to an uppermost one of the electrodes EGE, GGE, CGE and SGE may be used as gate electrodes of the string selection transistors SST2 (see FIG. 1) for controlling electrical connection between bit lines BL and the vertical patterns VC. Thicknesses of insulating layers ILD between the cell gate electrodes CGE may be substantially equal to each other, and an insulating layer ILD between the ground selection gate electrode GGE and the lowermost one of the cell gate electrodes CGE may be thicker than other insulating layers ILD.

The vertical structures VS may be disposed on the cell array region CAR of the horizontal semiconductor layer 100, and dummy vertical structures DVS may be disposed on the connection region CNR of the horizontal semiconductor layer 100. The vertical structures VS and the dummy vertical structures DVS may extend in the third direction D3 substantially perpendicular to the top surface of the horizontal semiconductor layer 100 and may penetrate the stack structure ST and the horizontal structure SC.

The vertical structures VS may be arranged in a line or in a zigzag form in one direction when viewed in a plan view. The dummy vertical structures DVS may penetrate end portions of the electrodes. The vertical structure VS may include the vertical pattern VC, a filling insulation pattern VI, a data storage pattern DSP, and a bit line conductive pad PAD.

The vertical pattern VC may have a pipe or macaroni shape. The filling insulation pattern VI may fill an empty space surrounded by the vertical pattern VC. The vertical pattern VC may include a semiconductor material such as silicon (Si), germanium (Ge), or a combination thereof. In addition, the vertical pattern VC may include a semiconductor material doped with dopants or an intrinsic semiconductor material not doped with dopants. The vertical pattern VC may include, for example, a poly-crystalline semiconductor material. The vertical pattern VC including the semiconductor material may be used as channel regions of the erase control, string selection, ground selection and memory cell transistors ECT, SST2, GST and MCT described with reference to FIG. 1. The vertical pattern VC may be electrically connected to a bit line BL through the bit line conductive pad PAD. "An element A filling an element B" (or similar language) as used herein may mean that the element A is in the element B but does not necessarily mean that the element A fills the element B entirely.

The data storage pattern DSP may be disposed between the stack structure ST and the vertical pattern VC. The data storage pattern DSP may extend in the third direction D3 and may surround a sidewall of the vertical pattern VC. The data storage pattern DSP may have a pipe or macaroni shape. A bottom surface of the data storage pattern DSP may be disposed at a lower level than a bottom surface of the erase control gate electrode EGE and may be in contact with the first horizontal pattern SCP1.

The dummy vertical structure DVS may be disposed on the connection region CNR of the horizontal semiconductor layer 100. The dummy vertical structure DVS may penetrate the pad portions of the electrodes, which are located on the connection region CNR. In some embodiments, a width of the dummy vertical structure DVS may be greater than a width of the vertical structure VS. In addition, the dummy vertical structure DVS may have substantially the same stack structure and materials as the vertical structure VS.

An upper planarization insulating layer 150 may be disposed on the horizontal semiconductor layer 100 to cover the staircase structure of the stack structure ST. The upper planarization insulating layer 150 may have a substantially flat top surface and may include a single insulating layer or a plurality of stacked insulating layers. The upper planarization insulating layer 150 may include, for example, a silicon oxide layer and/or a low-k dielectric layer.

A plurality of separation structures SS may be provided on the horizontal semiconductor layer 100. The separation structures SS may be arranged in the first direction D1 and may extend in the second direction D2 to intersect the stack structure ST. In some embodiments, the separation structures SS may be spaced apart from each other in the first direction D1 as illustrated in FIG. 2. Each of the separation structures SS may penetrate the stack structure ST and the horizontal structure SC and may be inserted in the horizontal semiconductor layer 100. Thus, each of the electrodes EGE, GGE, CGE and SGE in the stack structure ST may be divided into segments spaced apart from each other in the first direction D1 with the separation structure SS interposed therebetween. The separation structure SS may extend from the cell array region CAR onto the connection region CNR. The separation structure SS may be located between the vertical structures VS on the cell array region CAR. The separation structure SS may be located between cell contact plugs CPLG on the connection region CNR. A bottom end of the separation structure SS may be located at a lower level than the top surface of the horizontal semiconductor layer 100, and a top end of the separation structure SS may be located at a higher level than a top surface of the stack structure ST. The separation structure SS may include an insulating material. The separation structure SS may include, for example, at least one of silicon oxide or silicon nitride.

More particularly, referring to FIGS. 2, 3A to 3C and 4A, the data storage pattern DSP may include a plurality of thin layers. The data storage pattern DSP may be a data storage layer of a NAND flash memory device and may include a tunnel insulating layer TIL, a charge storage layer CIL and a blocking insulating layer BLK, which are sequentially stacked on a sidewall of the vertical pattern VC. For example, the charge storage layer CIL may include a trap insulating layer, a floating gate electrode, and/or an insulating layer including conductive nano dots. The charge storage layer CIL may include at least one of a silicon nitride layer, a silicon oxynitride layer, a silicon-rich nitride layer, a nano-crystalline silicon layer, or a laminated trap layer. The tunnel insulating layer TIL may include at least one of materials of which energy band gaps are greater than that of the charge storage layer CIL. The blocking insulating layer BLK may include, for example, a high-k dielectric layer such as an aluminum oxide layer and/or a hafnium oxide layer.

The first horizontal pattern SCP1 may penetrate the data storage pattern DSP and the vertical pattern VC and may be connected to the vertical pattern VC. The first horizontal pattern SCP1 may have a sidewall portion adjacent to the filling insulation pattern VI, and a thickness of the sidewall portion may be greater than a thickness of another portion, extending in a horizontal direction, of the first horizontal pattern SCP1. The sidewall portion of the first horizontal pattern SCP1 may cover a portion of a sidewall of the second horizontal pattern SCP2.

The horizontal semiconductor layer 100 may have a recess region RS adjacent to its top surface. The recess region RS may be recessed from the top surface of the horizontal semiconductor layer 100. The recess region RS may have a shape which is concave from the top surface of the horizontal semiconductor layer 100 toward a bottom surface of the horizontal semiconductor layer 100. A lower portion of the separation structure SS may be inserted in the horizontal semiconductor layer 100 to fill the recess region RS.

The separation structure SS may vertically penetrate the stack structure ST and the horizontal structure SC, as illustrated in FIG. 3B. Thus, each of the horizontal structure SC and the electrodes EGE, GGE, CGE and SGE of the stack structure ST may have inner sidewalls facing each other in the first direction D1 with the separation structure SS interposed therebetween. In some embodiments, the inner sidewalls of each of the horizontal structure SC and the electrodes EGE, GGE, CGE and SGE of the stack structure ST may be spaced apart from each other in the first direction D1 as illustrated in FIG. 3B.

Figure 4A:
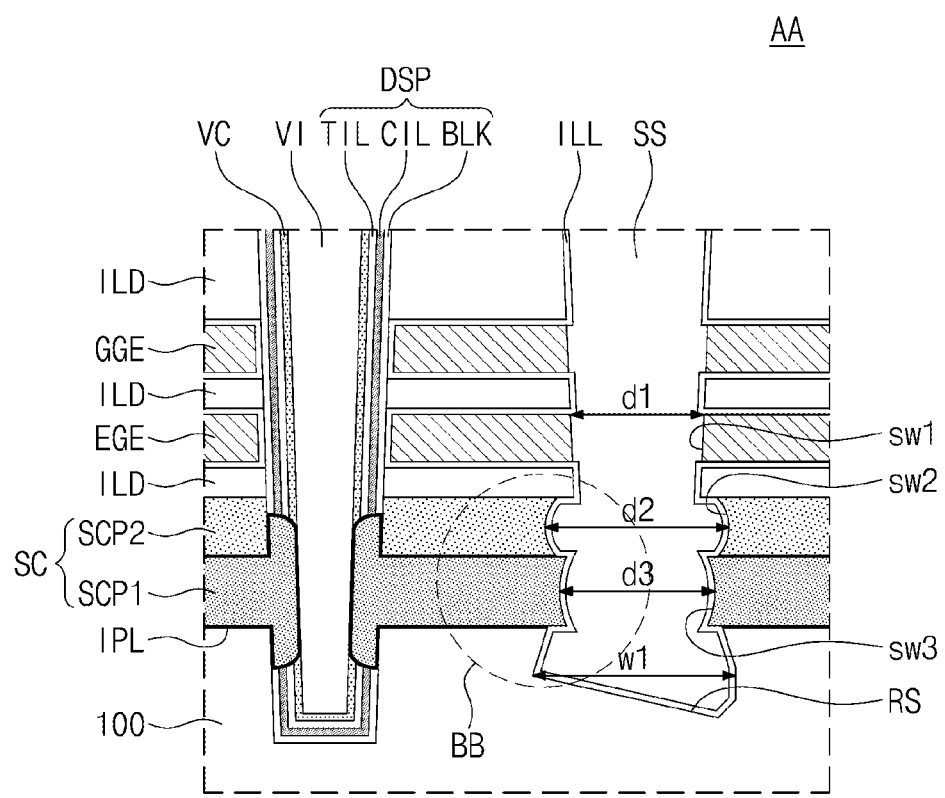
FIGS. 4A to 4E are enlarged views of a portion 'AA' of FIG. 3B.
Figure 5A:
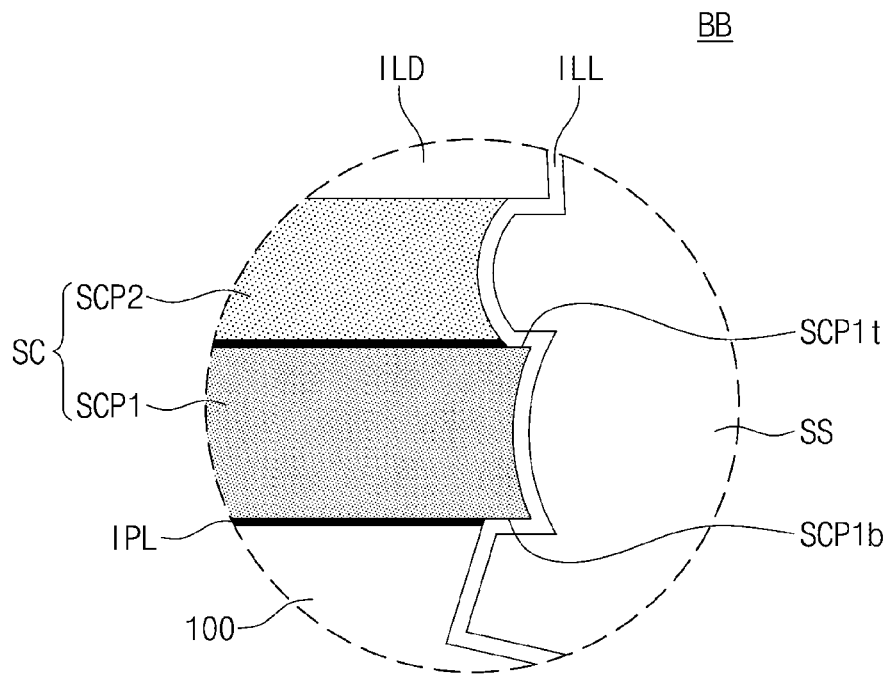
FIGS. 5A and 5B are enlarged cross-sectional views of a portion 'BB' of FIG. 4A.
Figure 5B:
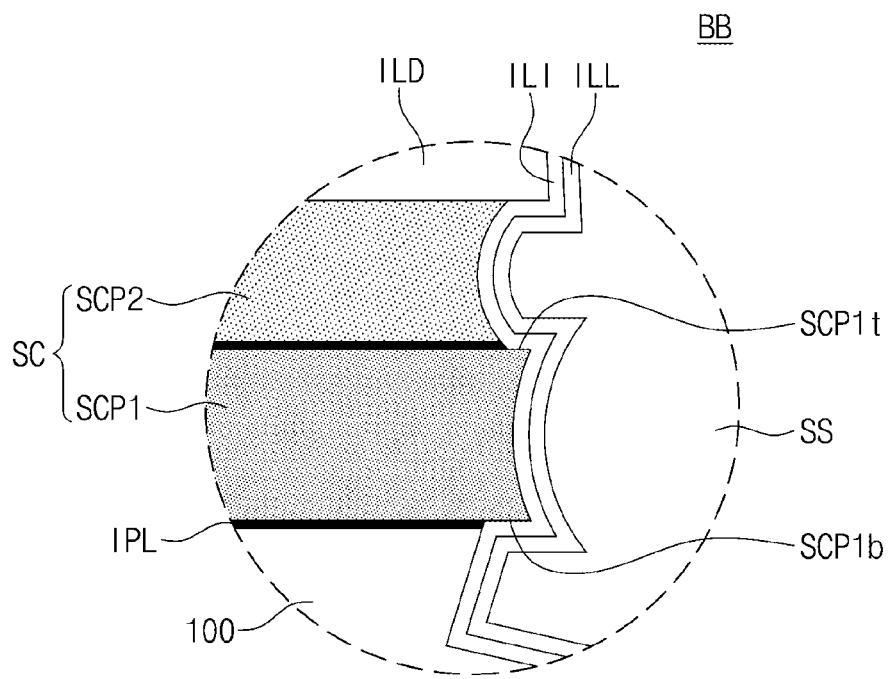

As illustrated in FIG. 4A, a first insulating layer ILL may be provided between the horizontal structure SC and the separation structure SS and between the horizontal semiconductor layer 100 and the separation structure SS. The first insulating layer ILL may cover the inner sidewalls of the horizontal structure SC and inner surfaces of the recess region RS. In addition, the first insulating layer ILL may be disposed between the insulating layers ILD and the electrodes EGE, GGE, CGE and SGE of the stack structure ST and between the data storage pattern DSP and the electrodes EGE, GGE, CGE and SGE. The first insulating layer ILL may include, for example, aluminum oxide.

Figure 4B:
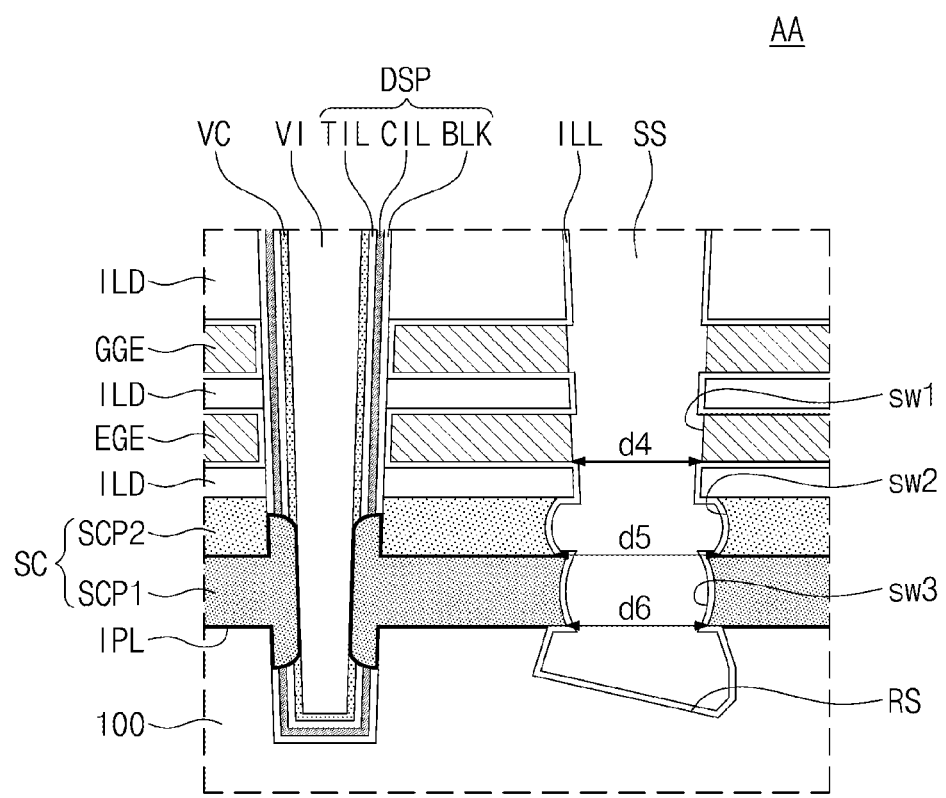

As illustrated in FIGS. 4A and 4B, a lowermost electrode EGE of the electrodes EGE, GGE, CGE and SGE may have first inner sidewalls sw1 facing each other with the separation structure SS interposed therebetween. The second horizontal pattern SCP2 of the horizontal structure SC may have second inner sidewalls sw2 facing each other with the separation structure SS interposed therebetween. The first horizontal pattern SCP1 of the horizontal structure SC may have third inner sidewalls sw3 facing each other with the separation structure SS interposed therebetween. The first to third inner sidewalls sw1, sw2 and sw3 may be located on the cell array region CAR, as illustrated in FIGS. 2 and 3B.

The first inner sidewalls sw1 of the lowermost electrode EGE may be inclined with respect to a direction (i.e., the third direction D3) perpendicular to the top surface of the horizontal semiconductor layer 100. A distance between the first inner sidewalls sw1 in the first direction D1 may become progressively less toward the horizontal structure SC. As illustrated in FIG. 4A, in some embodiments, the distance between the first inner sidewalls sw1 may have a maximum value (e.g., d1) at the same vertical level as a top surface of the lowermost electrode EGE. As illustrated in FIG. 4B, in some embodiments, the distance between the first inner sidewalls sw1 may have a minimum value (e.g., d4) at the same vertical level as a bottom surface of the lowermost electrode EGE.

The second inner sidewalls sw2 of the second horizontal pattern SCP2 may have shapes concavely recessed in the first direction D1 and a direction opposite to the first direction D1. In other words, a middle portion of the second inner sidewall sw2 may be recessed more than upper and lower portions of the second inner sidewall sw2. As illustrated in FIG. 4A, in some embodiments, a distance between the second inner sidewalls sw2 may have a maximum value (e.g., d2) at a vertical level lower than the upper surface of the second horizontal pattern SCP2 and higher than the lower surface of the second horizontal pattern SCP2. For example, the distance between the second inner sidewalls sw2 may have a maximum value at the vertical central portion of the second inner sidewalls sw2. In some embodiments, the distance between the second inner sidewalls sw2 may have a maximum value around a center of the second inner sidewalls sw2 in the third direction D3. As illustrated in FIG. 4B, in some embodiments, the distance between the second inner sidewalls sw2 may have a minimum value (e.g., d5) at the same vertical level as the bottom surface (or the top surface) of the second horizontal pattern SCP2.

The third inner sidewalls sw3 of the first horizontal pattern SCP1 may have shapes concavely recessed in the first direction D1 and the direction opposite to the first direction D1. In other words, a middle portion of the third inner sidewall sw3 may be recessed more than upper and lower portions of the third inner sidewall sw3. As illustrated in FIG. 4A, in some embodiments, a distance between the third inner sidewalls sw3 may have a maximum value (e.g., d3) at a vertical central portion of the second inner sidewalls sw2. In some embodiments, the distance between the third inner sidewalls sw3 may have a maximum value around a center of each third inner sidewall sw3 in the third direction D3. As illustrated in FIG. 4B, in some embodiments, the distance between the third inner sidewalls sw3 may have a minimum value (e.g., d6) at the same vertical level as the bottom surface (or the top surface) of the first horizontal pattern SCP1.

Since the first and second horizontal patterns SCP1 and SCP2 have the horizontally concave inner sidewalls, the separation structure SS may have horizontally convex shapes on the second inner sidewalls sw2 and the third inner sidewalls sw3.

The second inner sidewall sw2 may be horizontally recessed more than the first inner sidewall sw1 and the third inner sidewall sw3. In other words, a maximum distance d2 between the second inner sidewalls sw2 may be greater than a maximum distance d1 between the first inner sidewalls sw1 and a maximum distance d3 between the third inner sidewalls sw3. Since the second inner sidewall sw2 is horizontally recessed more than the third inner sidewall sw3, a portion of the top surface of the first horizontal pattern SCP1 may be exposed. In some embodiments, a portion of the top surface of the first horizontal pattern SCP1 may not be covered by the second horizontal pattern SCP2 as illustrated in FIG. 4A. The first insulating layer ILL may cover the portion of the top surface of the first horizontal pattern SCP1. In some embodiments, the first insulating layer ILL may contact the portion of the top surface of the first horizontal pattern SCP1 as illustrated in FIG. 4A.

As illustrated in FIGS. 4A to 4E, the recess region RS may have a polygonal shape in a cross section of the horizontal semiconductor layer 100, taken in the first direction D1. The recess region RS may have an asymmetric shape in the first direction D1. The recess region RS may have a bottom surface inclined with respect to the top surface of the horizontal semiconductor layer 100. The lower portion of the separation structure SS, which is located in the recess region RS, may have a shape similar to the shape of the recess region RS. The lower portion of the separation structure SS may have a polygonal shape when viewed in a cross-sectional view taken in the first direction D1. The lower portion of the separation structure SS may have an asymmetric shape in the first direction D1.

The separation structure SS may have a maximum width (e.g., w1) in the first direction D1 at a vertical level lower than the bottom surface of the first horizontal pattern SCP1. In other words, a portion (i.e., the lower portion) of the separation structure SS located in the recess region RS may have a width in the first direction D1 which is greater than that of another portion of the separation structure SS located outside the recess region RS.

A width w1 of the recess region RS may be greater than the maximum distance d3 between the third inner sidewalls sw3, as illustrated in FIG. 4A.

Figure 4C:
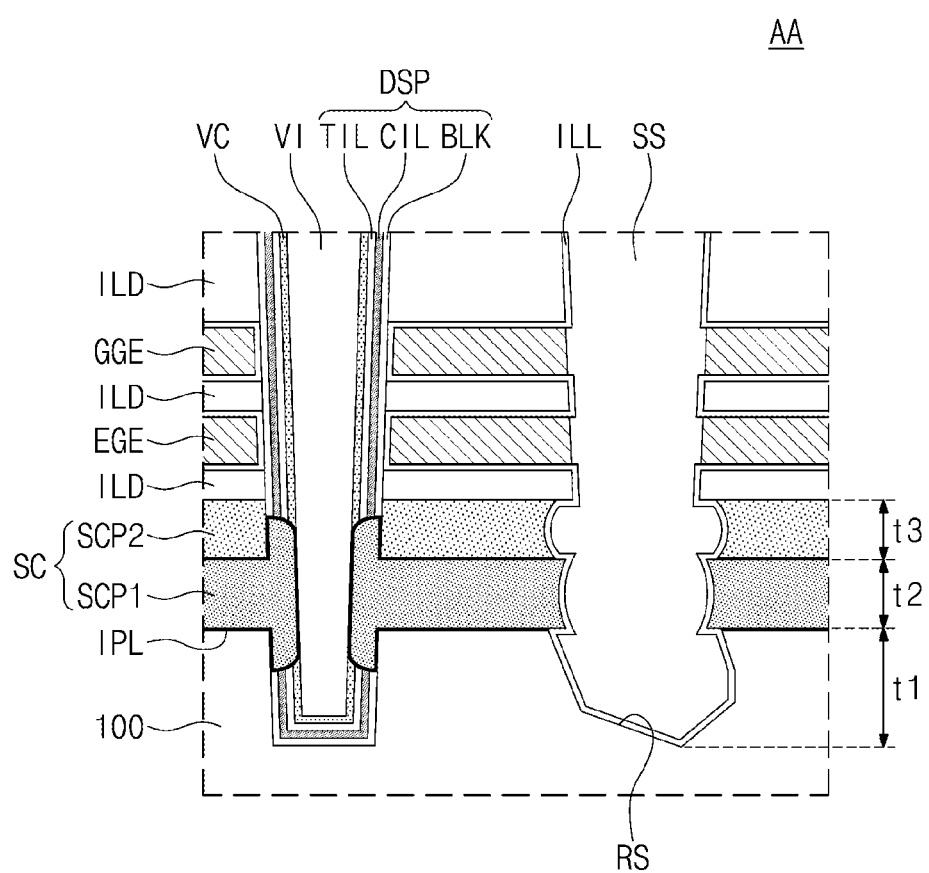

A depth t1 of the recess region RS may be greater than a thickness t2 of the first horizontal pattern SCP1 and a thickness t3 of the second horizontal pattern SCP2, as illustrated in FIG. 4C.

Figure 4D:
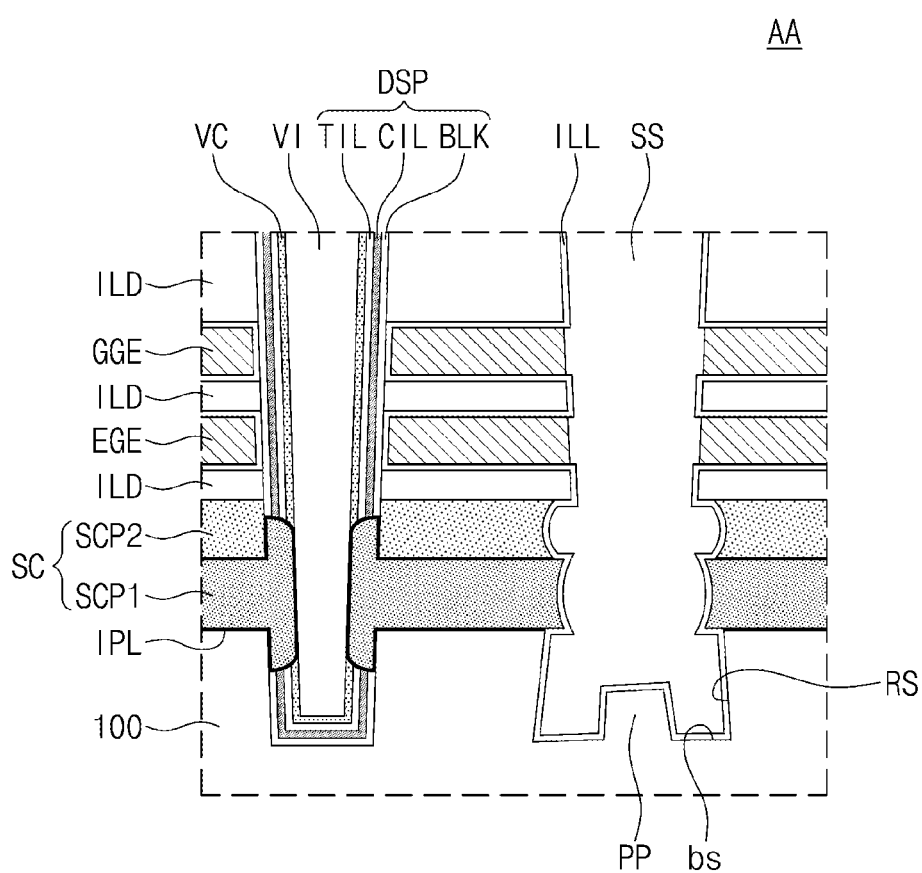

A portion of a bottom surface bs of the recess region RS may protrude toward the horizontal structure SC, as illustrated in FIG. 4D. In other words, the horizontal semiconductor layer 100 may have a protrusion PP which protrudes toward the horizontal structure SC in the recess region RS.

Figure 4E:
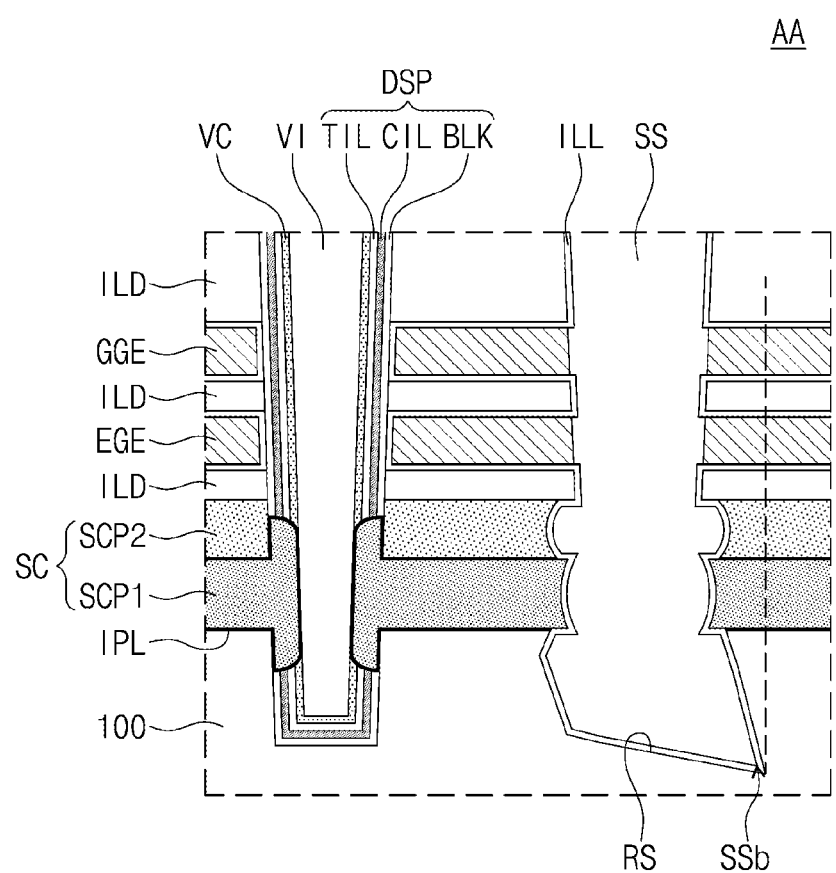

The separation structure SS may have a portion vertically overlapped by the electrodes EGE, GGE, CGE and SGE of the stack structure ST, as illustrated in FIG. 4E. For example, a bottom end SSb of the separation structure SS may be vertically overlapped by the electrodes EGE, GGE, CGE and SGE of the stack structure ST. As used herein, "an element A overlapping an element B in a vertical direction" (or similar language) means that at least one vertical line that intersects both the elements A and B exists.

Referring again to FIGS. 4A to 4E, an interface layer IPL may be provided to partially surround the first horizontal pattern SCP1. The interface layer IPL may be disposed between the first horizontal pattern SCP1 and the second horizontal pattern SCP2 and between the first horizontal pattern SCP1 and the horizontal semiconductor layer 100. In addition, the interface layer IPL may be disposed between the data storage pattern DSP and the first horizontal pattern SCP1 and between the vertical pattern VC and the first horizontal pattern SCP1. The interface layer IPL may not cover the third inner sidewalls sw3. The interface layer IPL may include, for example, a conductive material. The interface layer IPL may include, for example, carbon (C). The interface layer IPL may further include, for example, nitrogen (N) and oxygen (O).

Referring to FIG. 5A, in some embodiments, a top surface SCP1t of the first horizontal pattern SCP1 may protrude toward the separation structure SS beyond one of the second inner sidewalls sw2 of the second horizontal pattern SCP2 such that the second horizontal pattern SCP2 may not vertically overlap a first portion of the top surface SCP1t of the first horizontal pattern SCP1, as illustrated in FIG. 5A. The first insulating layer ILL may cover the first portion of the top surface SCP1t of the first horizontal pattern SCP1, and the interface layer IPL may cover a second portion of the top surface SCP1t of the first horizontal pattern SCP1. In some embodiments, the first insulating layer ILL may contact the first portion of the top surface SCP1t of the first horizontal pattern SCP1, and the interface layer IPL may contact the second portion of the top surface SCP1t of the first horizontal pattern SCP1, as illustrated in FIG. 5A.

In some embodiments, a bottom surface SCP1b of the first horizontal pattern SCP1 may protrude toward the separation structure SS beyond a sidewall of the recess region RS as illustrated in FIG. 5A. The interface layer IPL may cover a first portion of the bottom surface SCP1b of the first horizontal pattern SCP1, and the first insulating layer ILL may cover a second portion of the bottom surface SCP1b of the first horizontal pattern SCP1. In some embodiments, the interface layer IPL may contact the first portion of the bottom surface SCP1b of the first horizontal pattern SCP1, and the first insulating layer ILL may contact the second portion of the bottom surface SCP1b of the first horizontal pattern SCP1 as illustrated in FIG. 5A. In some embodiments, the first insulating layer ILL may be in direct contact with the top surface SCP1t and the inner sidewall of the first horizontal pattern SCP1.

Referring to FIG. 5B, a second insulating layer ILI may be disposed between the first insulating layer ILL and the horizontal semiconductor layer 100 and between the first insulating layer ILL and the horizontal structure SC. The second insulating layer ILI may be in direct contact with the inner surfaces of the recess region RS of the horizontal semiconductor layer 100 and the inner sidewalls of the horizontal structure SC. The second insulating layer ILI may include, for example, at least one of silicon oxide or silicon nitride.

Referring again to FIGS. 2 to 3C, a first interlayer insulating layer 121 may be disposed on the stack structure ST and the upper planarization insulating layer 150, and a second interlayer insulating layer 123 may be disposed on the first interlayer insulating layer 121. The separation structure SS may penetrate the first interlayer insulating layer 121. The second interlayer insulating layer 123 may cover a top surface of the separation structure SS. Bit lines BL may be disposed on the second interlayer insulating layer 123. The bit lines BL may extend in the first direction D1. The bit lines BL may be electrically connected to the bit line conductive pads PAD through bit line contact plugs BPLG.

Figure 6:
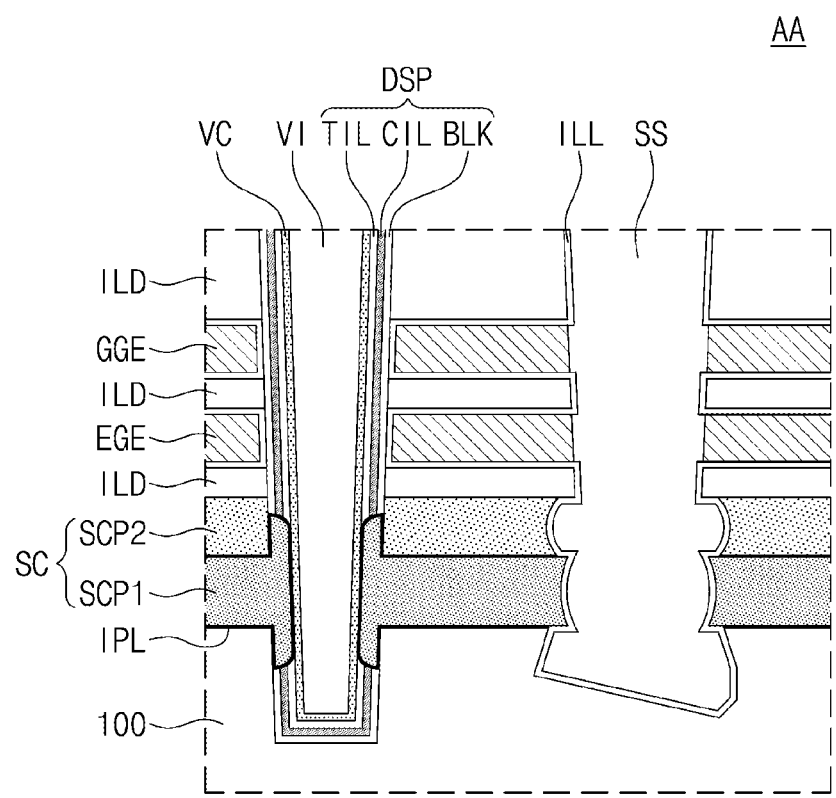
FIG. 6 is an enlarged cross-sectional view corresponding to the portion 'AA' of FIG. 3B to illustrate a 3D semiconductor memory device according to some embodiments of the inventive concepts.

FIG. 6 is an enlarged cross-sectional view corresponding to the portion 'AA' of FIG. 3B to illustrate a 3D semiconductor memory device according to some embodiments of the inventive concepts.

Referring to FIG. 6, the first horizontal pattern SCP1 may penetrate the data storage pattern DSP so as to be connected to a sidewall of the vertical pattern VC. The first horizontal pattern SCP1 may not penetrate the vertical pattern VC, unlike FIGS. 4A to 4E.

Figure 7A:
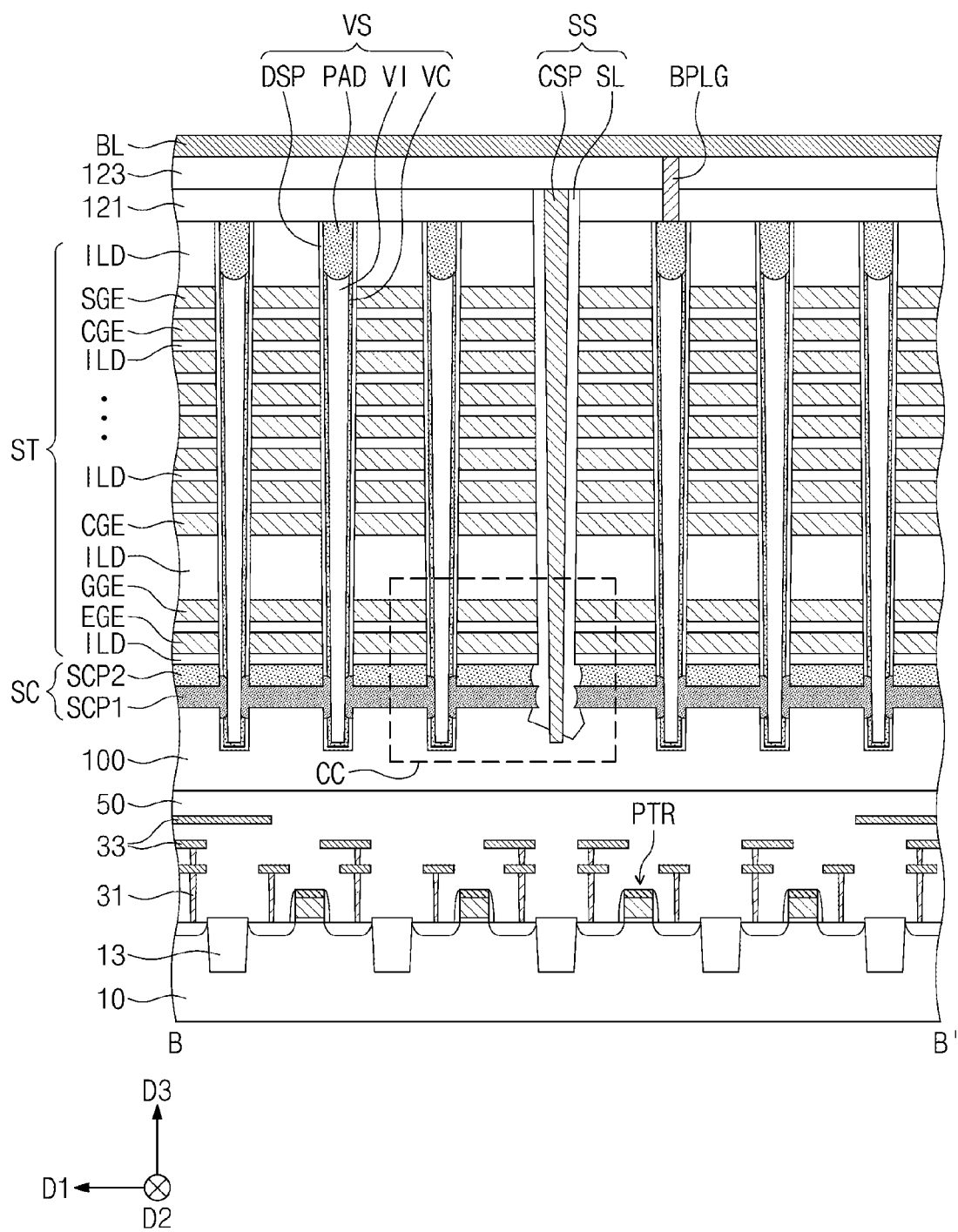
FIG. 7A is a cross-sectional view taken along the line B-B' of FIG. 2 to illustrate a 3D semiconductor memory device according to some embodiments of the inventive concepts.
Figure 7B:
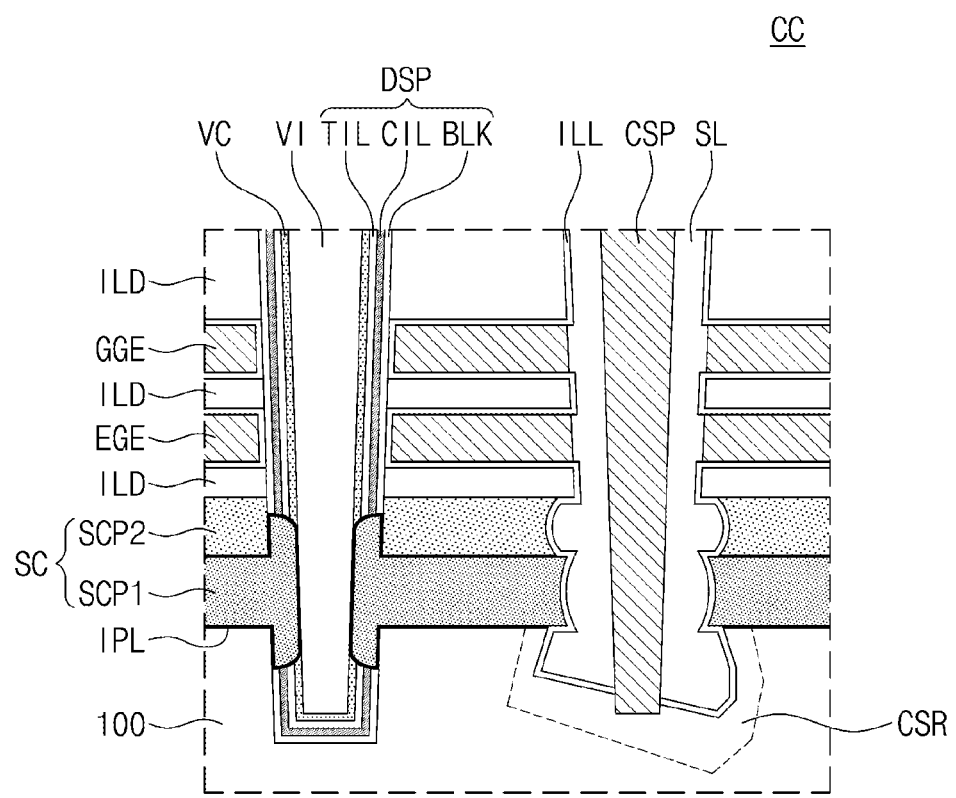
FIG. 7B is an enlarged cross-sectional view of a portion 'CC' of FIG. 7A.

FIG. 7A is a cross-sectional view taken along the line B-B' of FIG. 2 to illustrate a 3D semiconductor memory device according to some embodiments of the inventive concepts. FIG. 7B is an enlarged cross-sectional view of a portion 'CC' of FIG. 7A.

Referring to FIGS. 7A and 7B, a separation structure SS may include a common source plug CSP and a sidewall spacer SL. The common source plug CSP may be connected to a common source region CSR formed in the horizontal semiconductor layer 100 between the stack structures ST. The common source plug CSP may be electrically connected to the horizontal structure SC. For example, the common source plug CSP may include at least one of a metal (e.g., tungsten, copper, or aluminum), a conductive metal nitride (e.g., titanium nitride or tantalum nitride), or a transition metal (e.g., titanium or tantalum). In some embodiments, the common source plug CSP may have a substantially uniform upper width and may extend in the second direction D2. The sidewall spacer SL formed of an insulating material may be disposed between the common source plug CSP and the stack structure ST. The common source region CSR may include N-type dopants and may extend in the second direction D2 in parallel to the stack structures ST. In some embodiments, the common source region CSR may be omitted.

Figure 8:
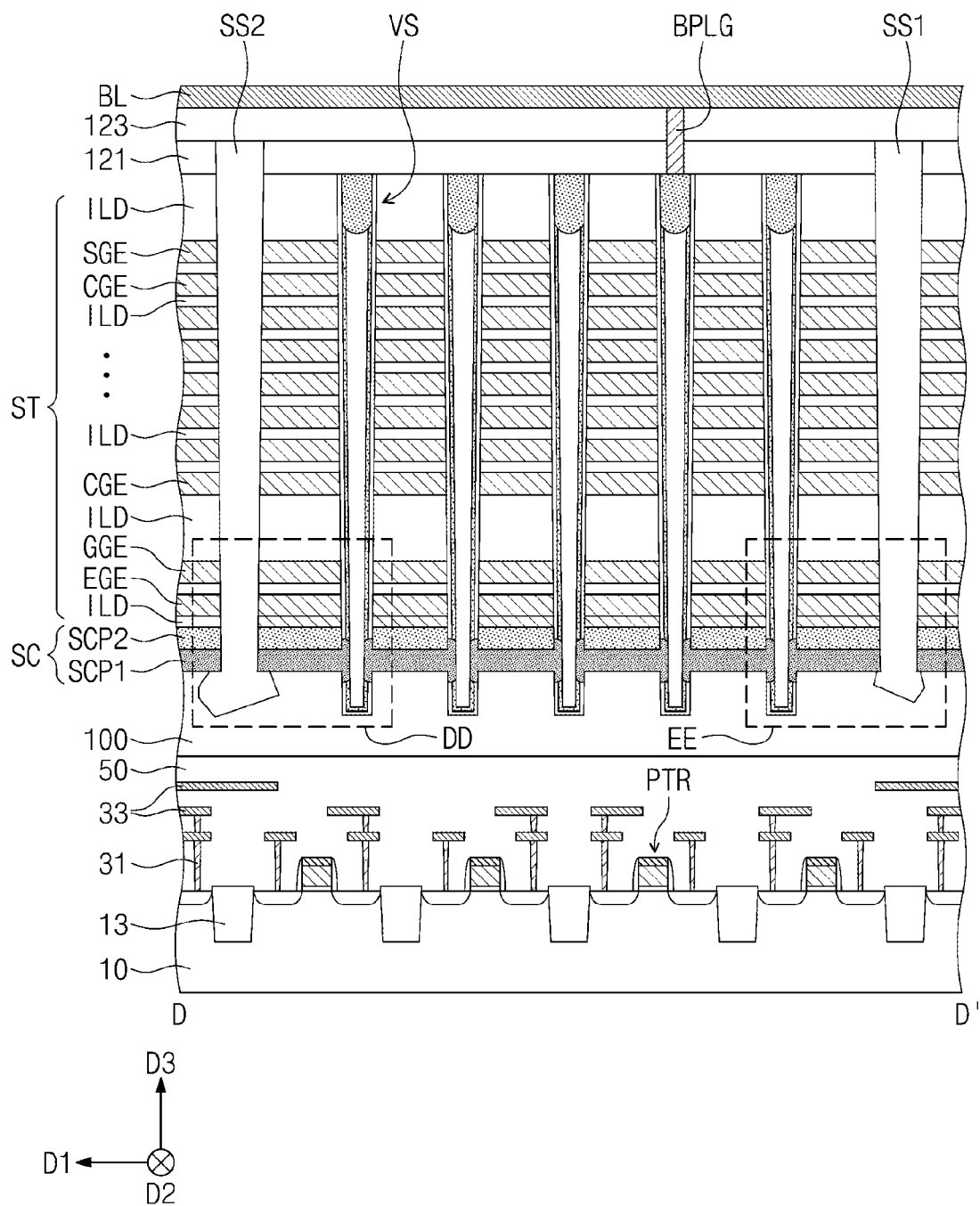
FIG. 8 is a cross-sectional view taken along a line D-D' of FIG. 2 to illustrate a 3D semiconductor memory device according to some embodiments of the inventive concepts.
Figure 9:
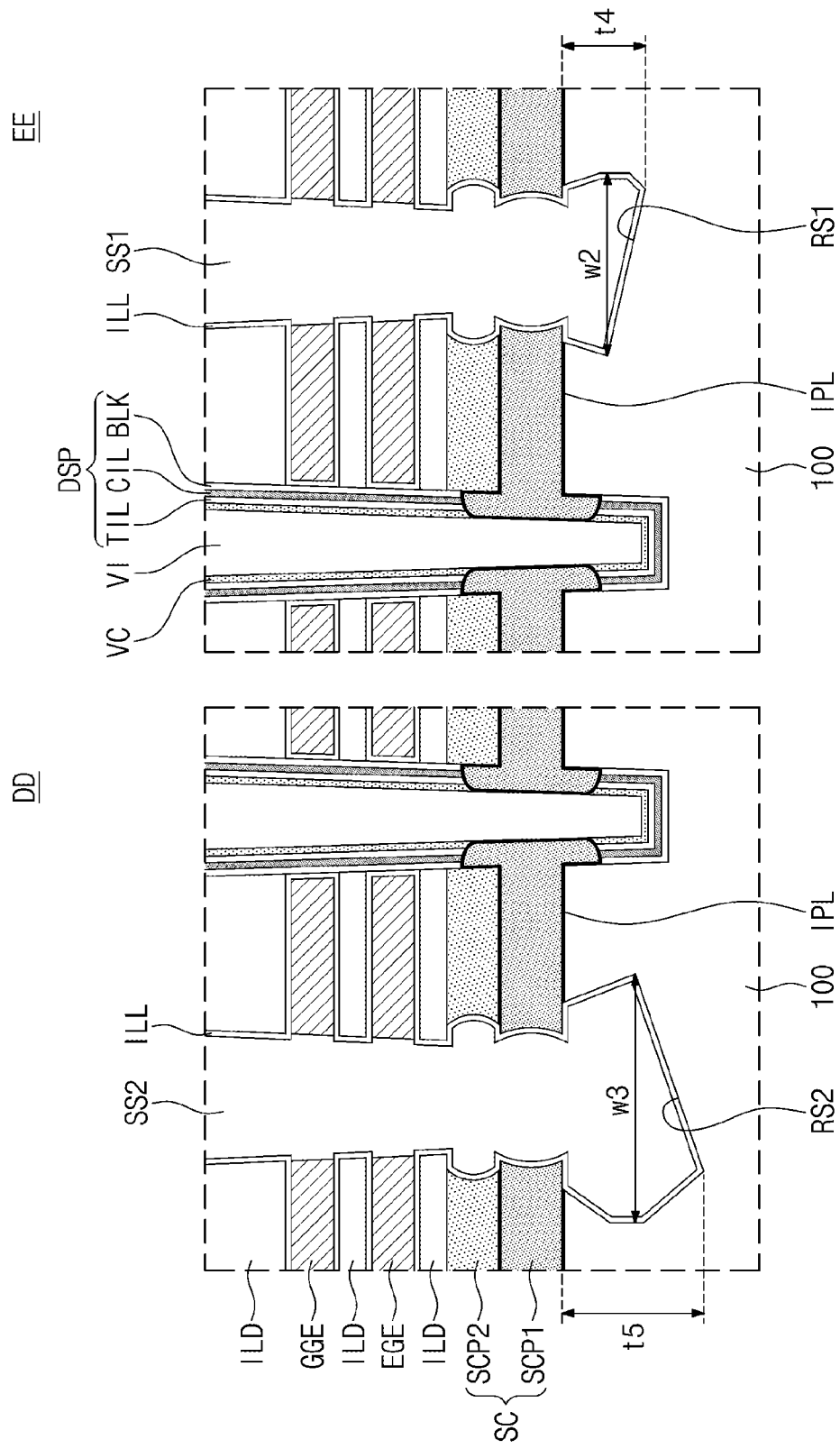
FIG. 9 illustrates enlarged cross-sectional views of portions 'DD' and 'EE' of FIG. 8.

FIG. 8 is a cross-sectional view taken along a line D-D' of FIG. 2 to illustrate a 3D semiconductor memory device according to some embodiments of the inventive concepts. FIG. 9 illustrates enlarged cross-sectional views of portions 'DD' and 'EE' of FIG. 8. Hereinafter, the descriptions to the same or similar components as mentioned with reference to FIGS. 1 to 7B may be omitted for the purpose of ease and convenience in explanation.

Referring to FIGS. 8 and 9, a first separation structure SS1 may be provided on one sidewall of the stack structure ST, and a second separation structure SS2 may be provided on another sidewall of the stack structure ST. The first and second separation structures SS1 and SS2 may be two, adjacent to each other in the first direction D1, of the plurality of separation structures SS. In some embodiments, no separation structure is provided between the first and second separation structures SS1 and SS2 as illustrated in FIG. 8.

The first and second separation structures SS1 and SS2 may have different lengths in a vertical direction (i.e., the third direction D3). The first separation structure SS1 may fill a first recess region RS1 of the horizontal semiconductor layer 100, and the second separation structure SS2 may fill a second recess region RS2 of the horizontal semiconductor layer 100. A depth t4 of the first recess region RS1 may be different from a depth t5 of the second recess region RS2. In some embodiments, the depth t5 of the second recess region RS2 may be greater than the depth t4 of the first recess region RS1, and thus the length of the second separation structure SS2 in the vertical direction may be greater than the length of the first separation structure SS1 in the vertical direction.

A width w3 of the second recess region RS2 may be greater than a width w2 of the first recess region RS1. Thus, a width of a lower portion of the second separation structure SS2 may be greater than a width of a lower portion of the first separation structure SS1.

Figure 10:
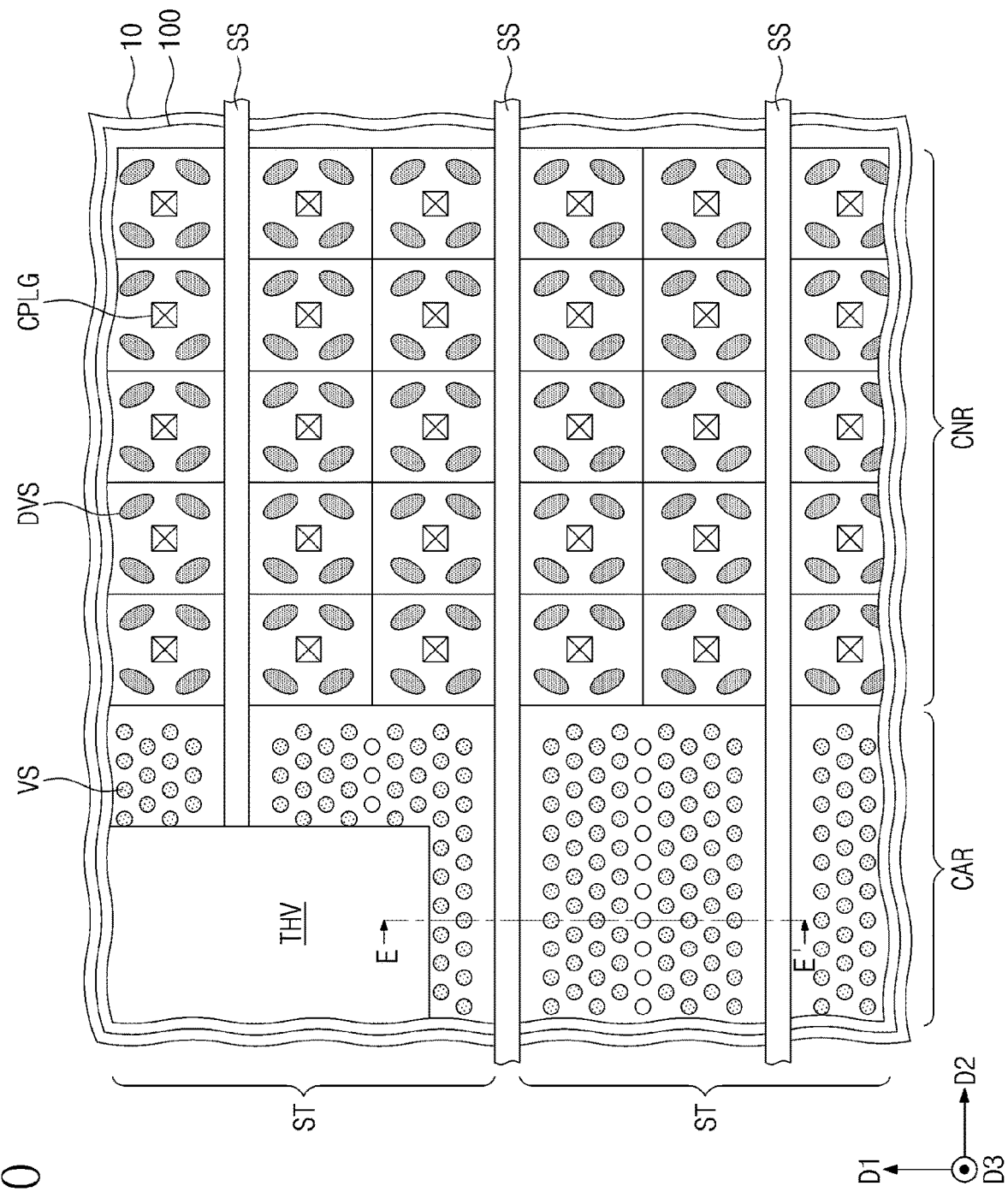
FIG. 10 is a plan view illustrating a 3D semiconductor memory device according to some embodiments of the inventive concepts.
Figure 11:
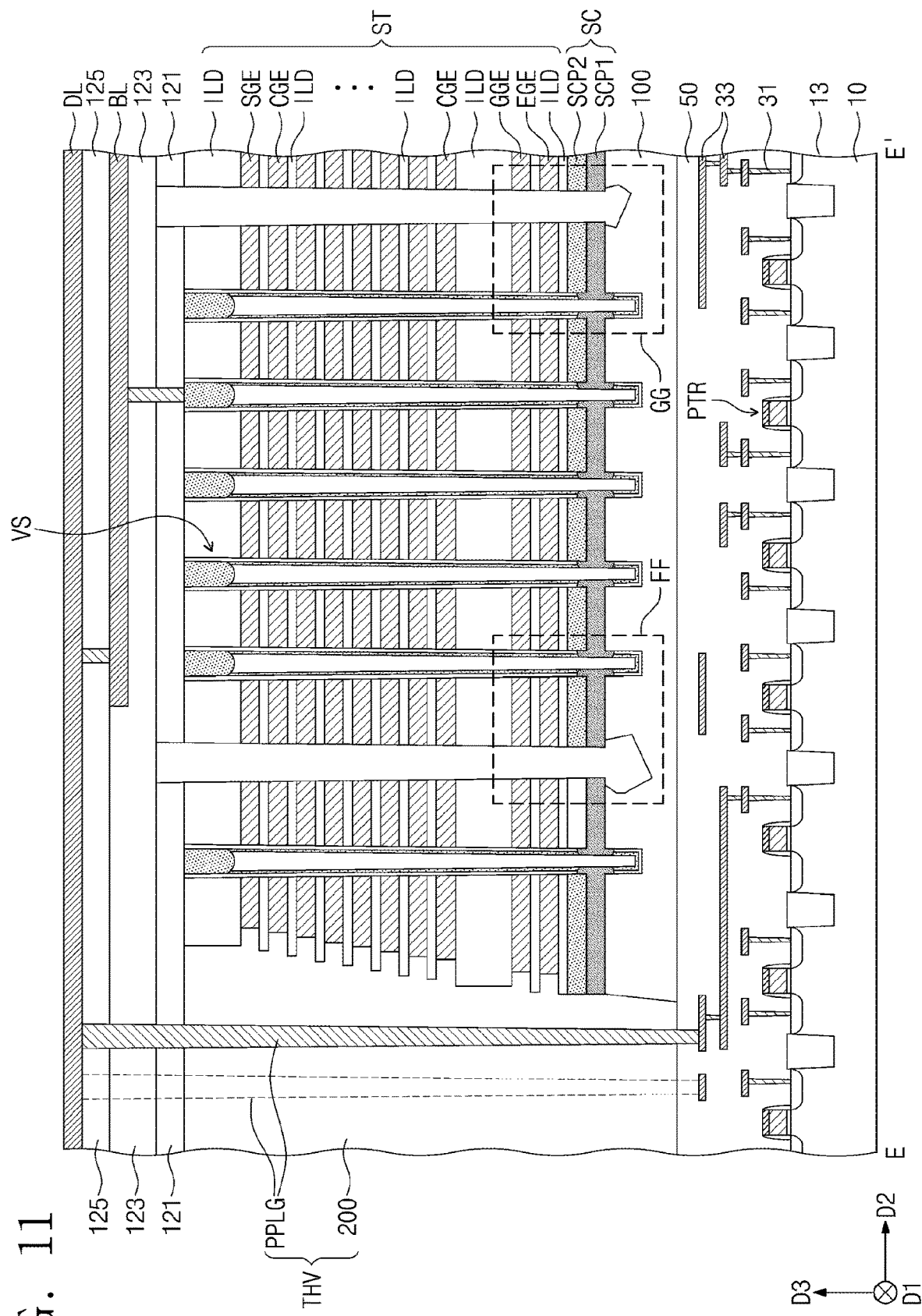
FIG. 11 is a cross-sectional view taken along a line E-E' of FIG. 10 to illustrate a 3D semiconductor memory device according to some embodiments of the inventive concepts.
Figure 12:
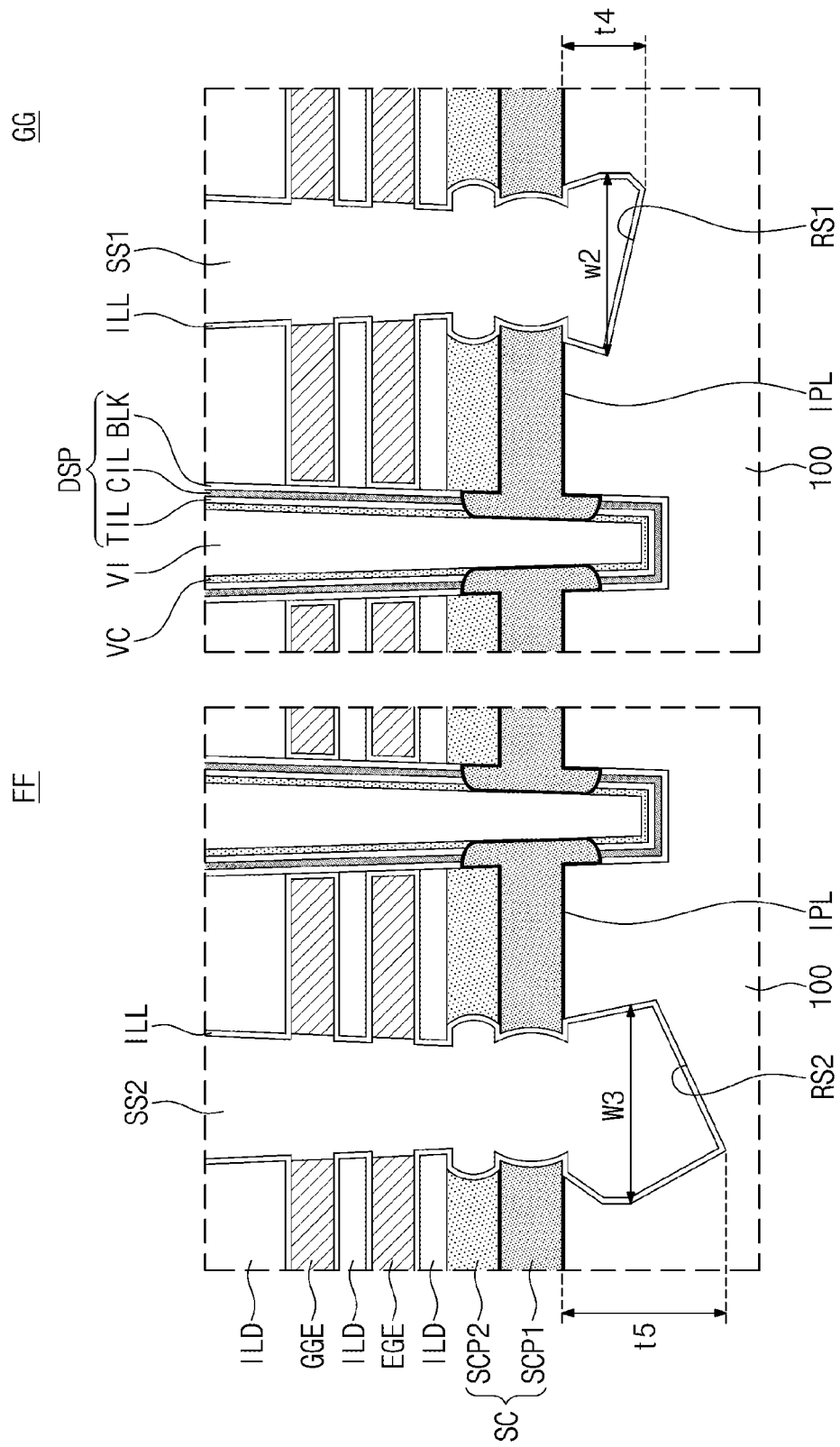
FIG. 12 illustrates enlarged cross-sectional views of portions 'FF' and GG' of FIG. 11.

FIG. 10 is a plan view illustrating a 3D semiconductor memory device according to some embodiments of the inventive concepts. FIG. 11 is a cross-sectional view taken along a line E-E' of FIG. 10 to illustrate a 3D semiconductor memory device according to some embodiments of the inventive concepts. FIG. 12 illustrates enlarged cross-sectional views of portions 'FF' and 'GG' of FIG. 11. Hereinafter, the descriptions to the same or similar components as mentioned with reference to FIGS. 1 to 9 may be omitted for the purpose of ease and convenience in explanation.

Referring to FIGS. 10 to 12, a 3D semiconductor memory device according to some embodiments of the inventive concepts may include a through-interconnection structure THV.

The through-interconnection structure THV may penetrate portions of the stack structures ST and a portion of the horizontal semiconductor layer 100. In some embodiments, the through-interconnection structure THV may penetrate a portion of the stack structure ST, which is spaced apart from the staircase structure of the stack structure ST. In other words, the through-interconnection structure THV may be disposed on the cell array region CAR. The through-interconnection structure THV may be adjacent to one of the separation structures SS in the first direction D1. Some of the vertical structures VS may be disposed between the through-interconnection structure THV and the one of the separation structures SS. The some of the vertical structures VS may be dummy vertical structures not constituting the cell strings CSTR of FIG. 1. The through-interconnection structure THV may include a through-insulating pattern 200, through-plugs PPLG penetrating the through-insulating pattern 200, and conductive lines DL connected to the through-plugs PPLG. The through-plugs PPLG may penetrate the through-insulating pattern 200 so as to be connected to the peripheral circuit interconnection lines 33 of the peripheral logic structure PS.

A vertical length of a second separation structure SS2 closest to the through-interconnection structure THV may be greater than a vertical length of a first separation structure SS1, as illustrated in FIGS. 11 and 12. More particularly, a depth t5 of a second recess region RS2 filled with the second separation structure SS2 may be greater than a depth t4 of a first recess region RS1 filled with the first separation structure SS1. Here, a width w3 of the second recess region RS2 may be greater than a width w2 of the first recess region RS1.

[Manufacturing Method]

Figure 13A:
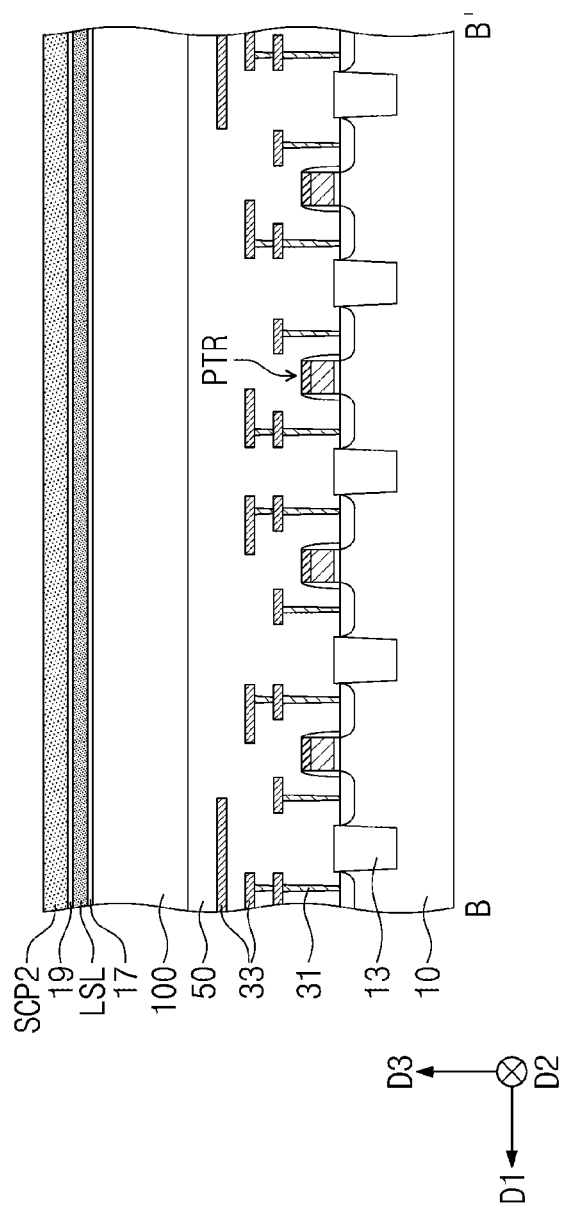
FIGS. 13A, 14A, 15A, 16A, 17A and 20A are cross-sectional views taken along the line B-B' of FIG. 2 to illustrate a method for manufacturing a 3D semiconductor memory device, according to some embodiments of the inventive concepts.
Figure 13B:
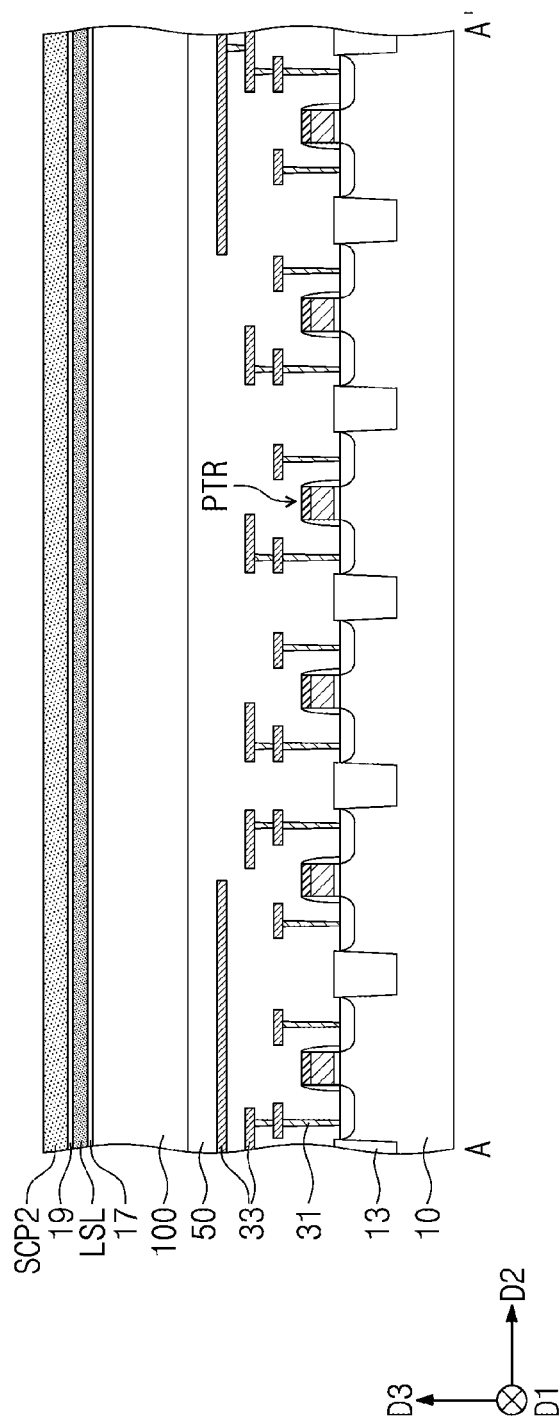
FIGS. 13B and 14B are cross-sectional views taken along the line A-A' of FIG. 2 to illustrate a method for manufacturing a 3D semiconductor memory device, according to some embodiments of the inventive concepts.
Figure 14A:
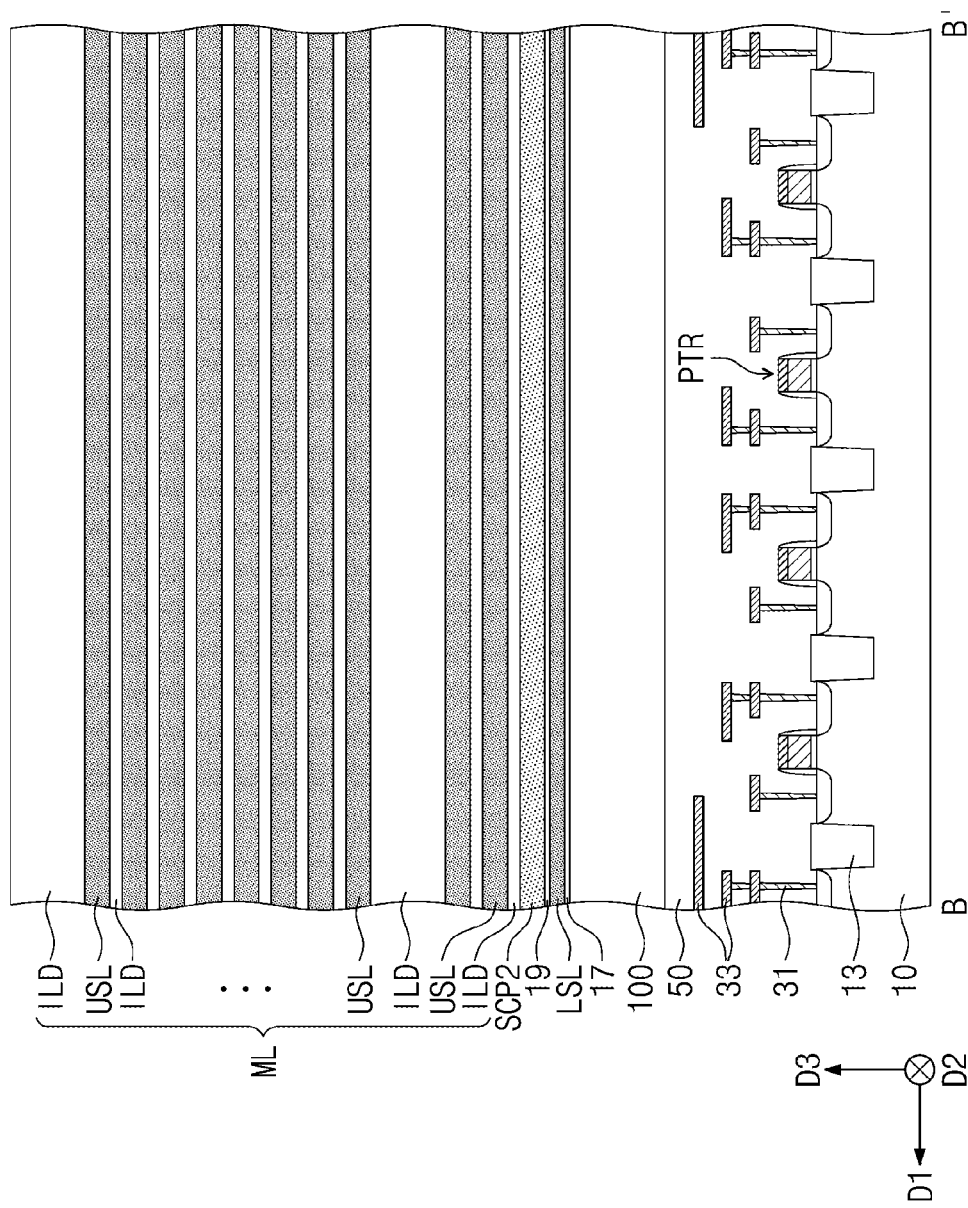
Figure 14B:
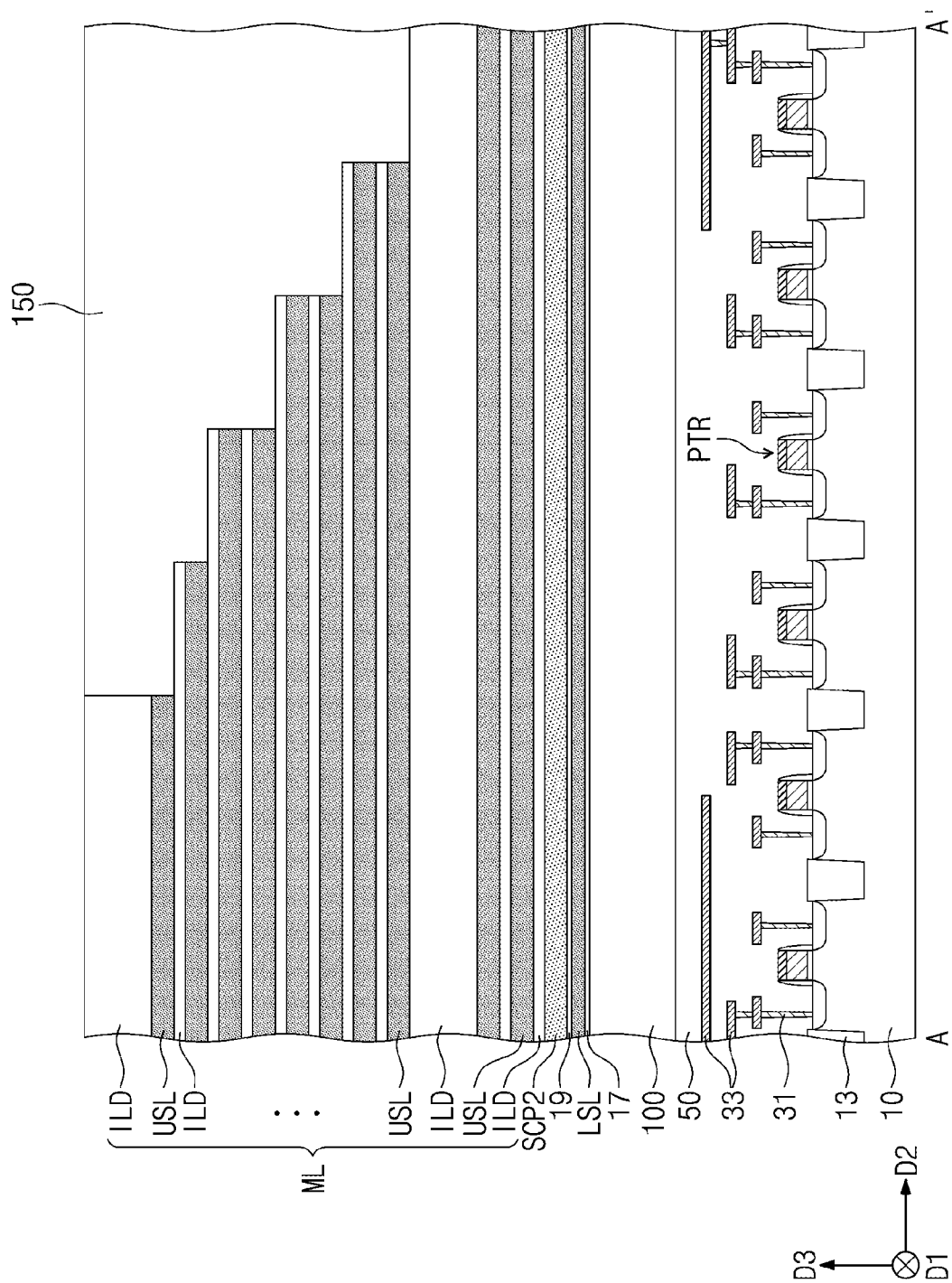
Figure 15A:
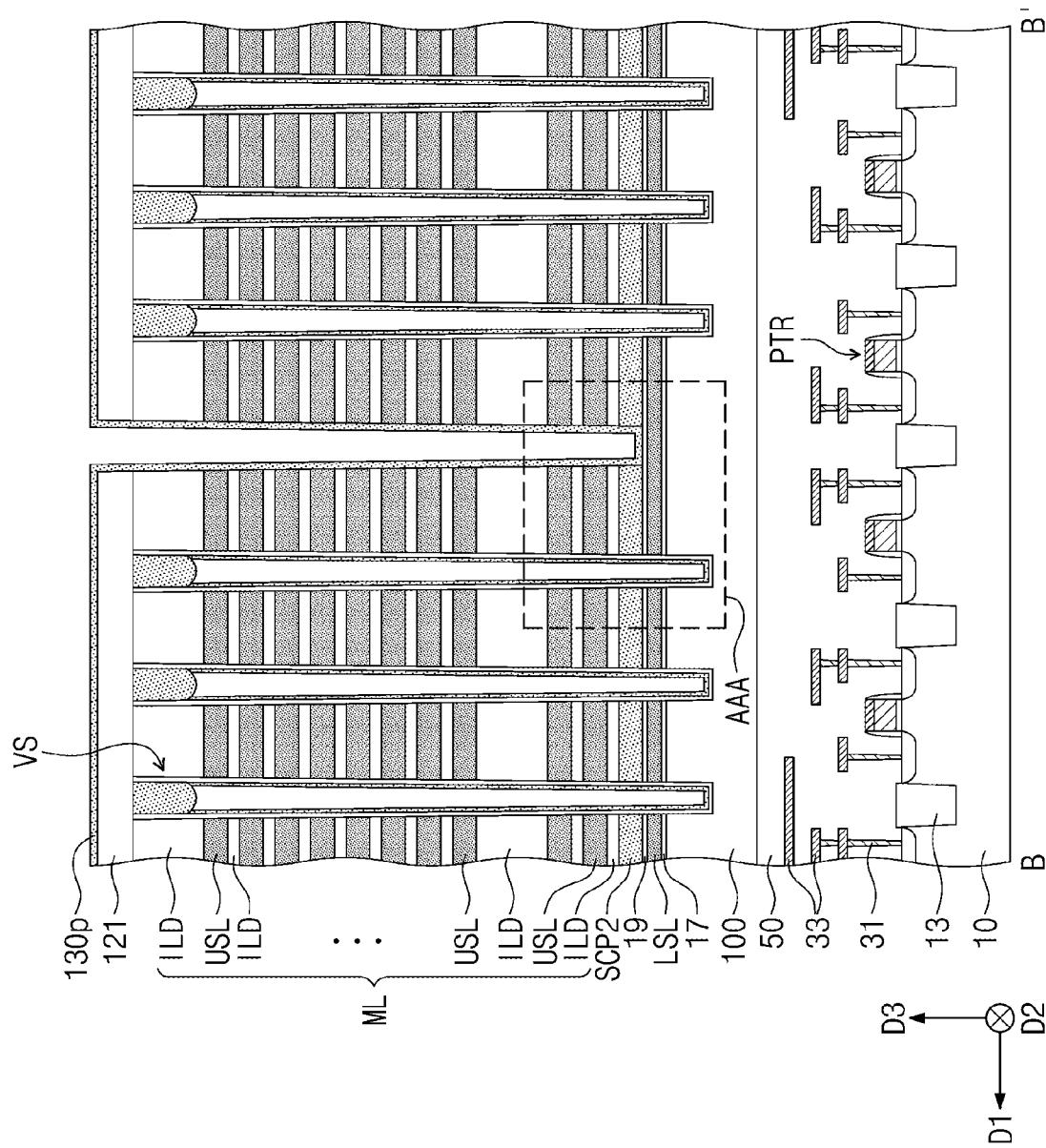
Figure 15B:
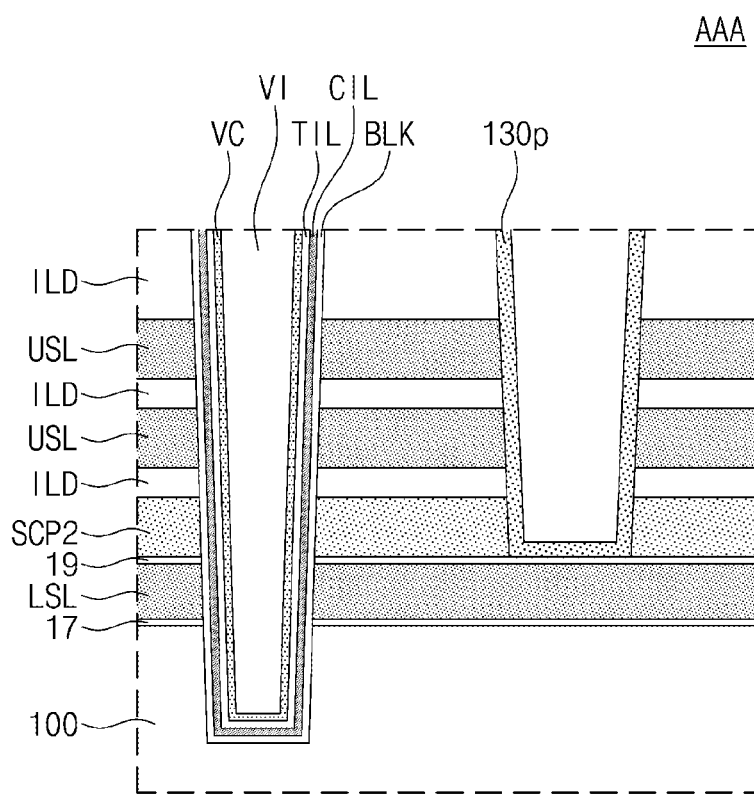
FIG. 15B is an enlarged view of a portion AAA of FIG. 15A, FIGS. 16B and 16C are enlarged views of a portion AAA of FIG. 16A, FIGS. 17B, 18, and 19 are enlarged views of a portion AAA of FIG. 17A, and FIGS. 20B and 20C are enlarged views of a portion 'AAA' of FIG. 20A according to some embodiments of the inventive concepts.
Figure 16A:
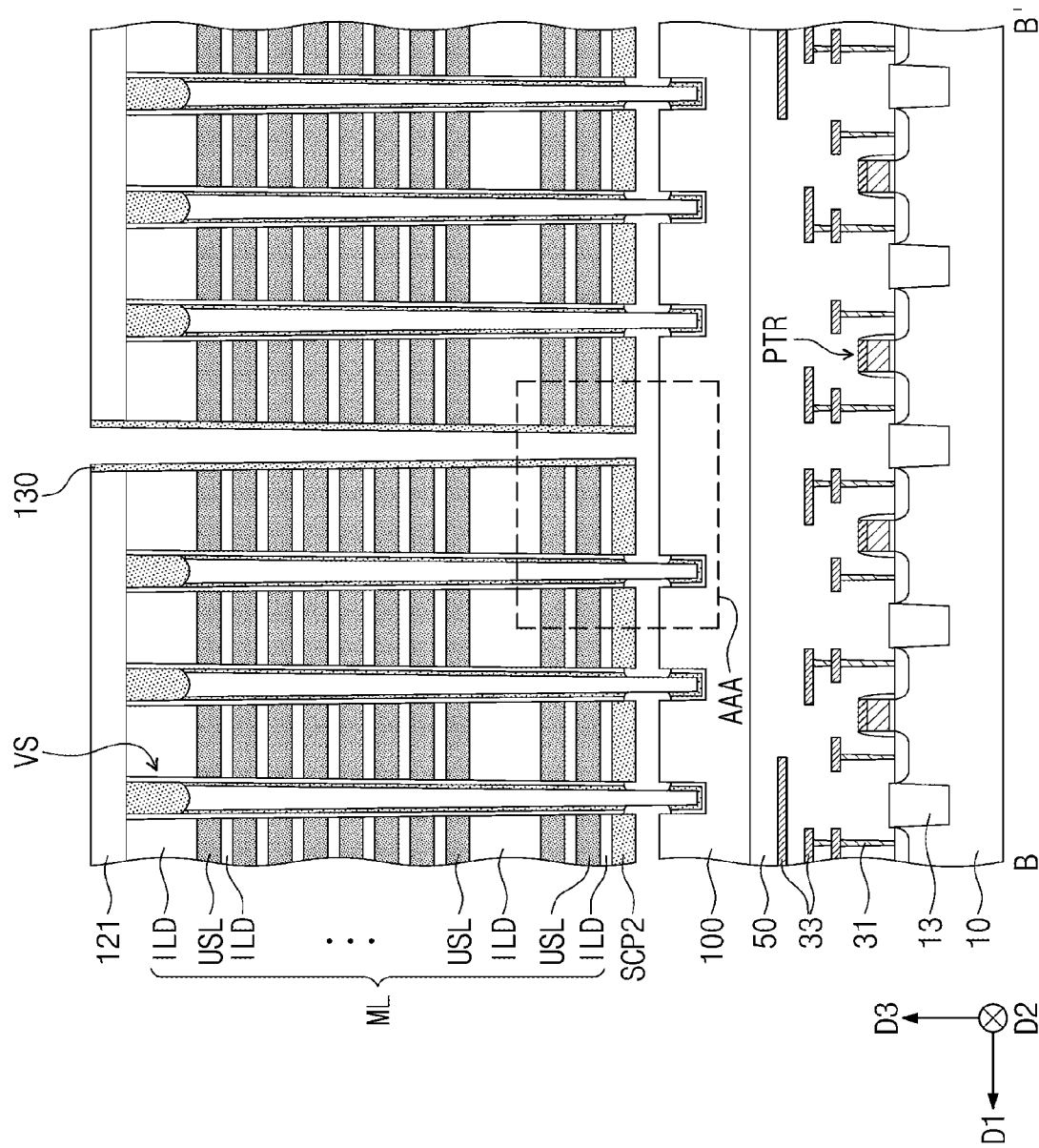
Figure 16B:
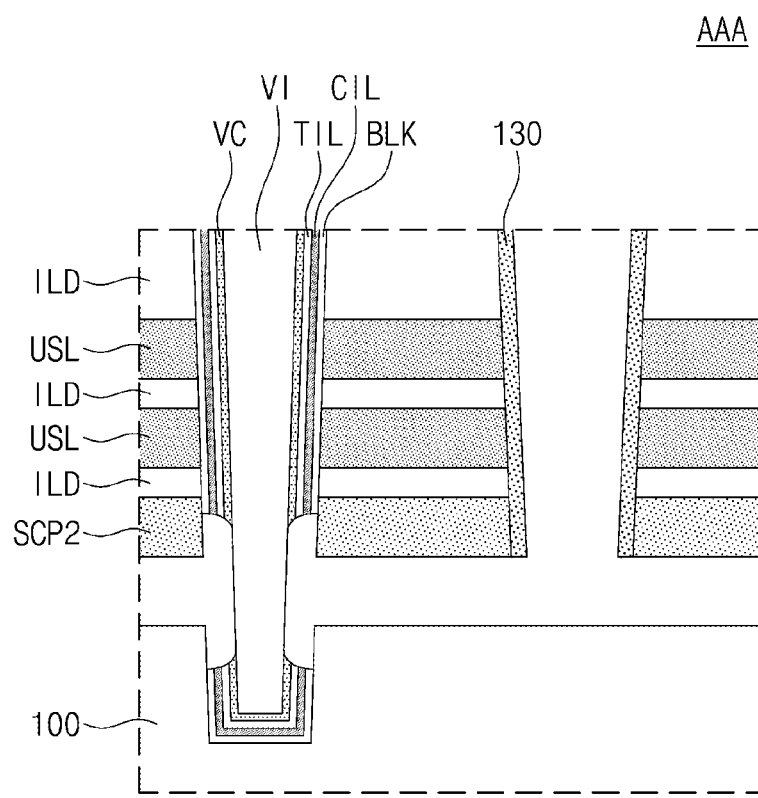
Figure 16C:
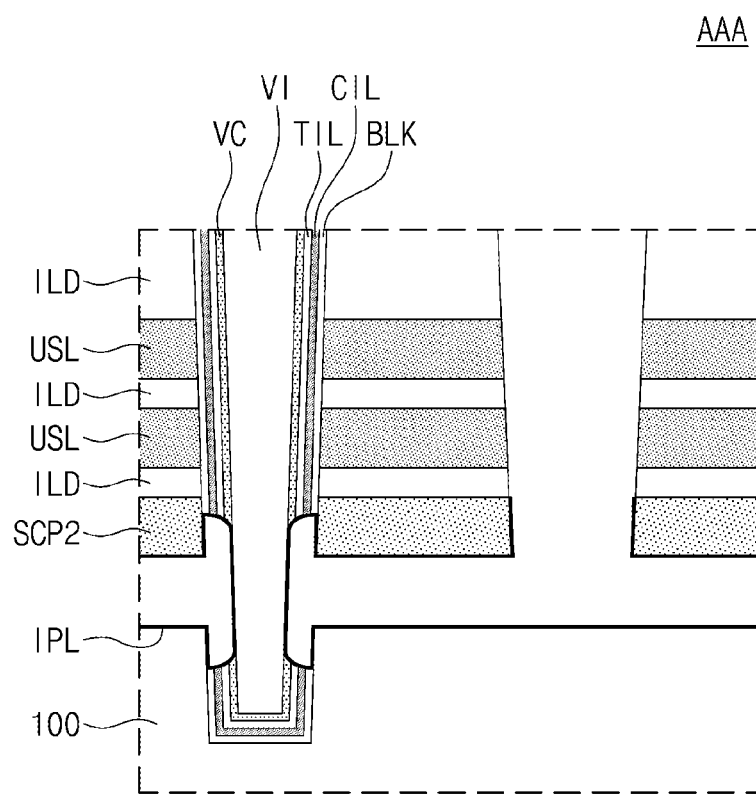
Figure 17A:
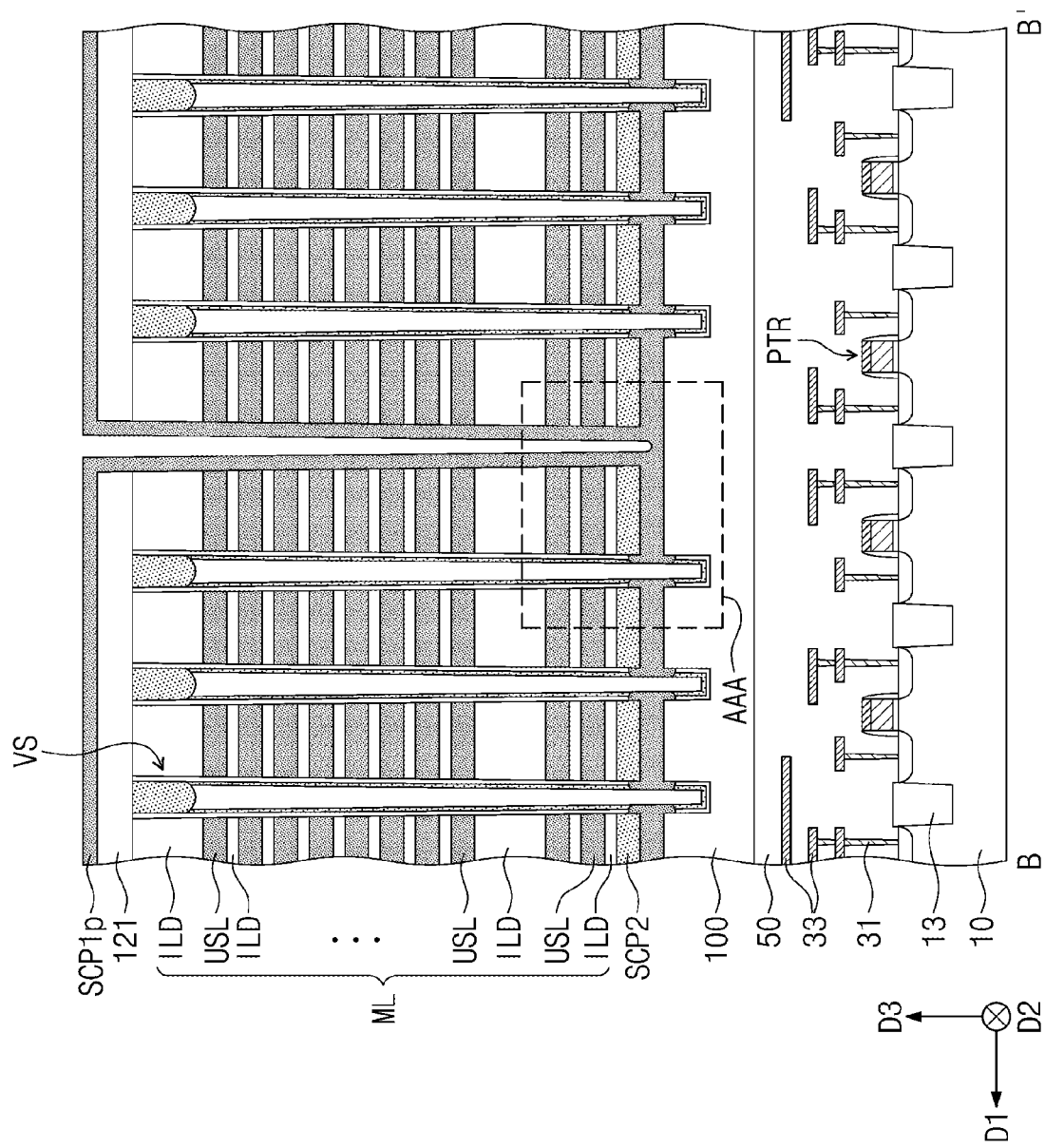

FIGS. 13A, 14A, 15A, 16A, 17A and 20A are cross-sectional views taken along the line B-B' of FIG. 2 to illustrate a method for manufacturing a 3D semiconductor memory device, according to some embodiments of the inventive concepts. FIGS. 13B and 14B are cross-sectional views taken along the line A-A' of FIG. 2 to illustrate a method for manufacturing a 3D semiconductor memory device, according to some embodiments of the inventive concepts. FIG. 15B is an enlarged view of a portion AAA of FIG. 15A, FIGS. 16B and 16C are enlarged views of a portion AAA of FIG. 16A, FIGS. 17B, 18, and 19 are enlarged views of a portion AAA of FIG. 17A, and FIGS. 20B and 20C are enlarged views of a portion 'AAA' of FIG. 20A to illustrate a method for manufacturing a 3D semiconductor memory device, according to some embodiments of the inventive concepts.

Referring to FIGS. 13A and 13B, a peripheral logic structure PS may be formed on a lower substrate 10. The lower substrate 10 may be, for example, a bulk silicon substrate. A device isolation layer 13 may be formed in the lower substrate 10 to define active regions.

The formation of the peripheral logic structure PS may include forming peripheral logic circuits PTR on the lower substrate 10, forming peripheral interconnection structures 31 and 33 connected to the peripheral logic circuits PTR, and forming a lower insulating layer 50. Here, the peripheral logic circuits PTR may include MOS transistors using portions of the lower substrate 10 as channels. For example, the formation of the peripheral logic circuits PTR may include forming the device isolation layer 13 defining the active regions in the lower substrate 10, forming a peripheral gate insulating layer and a peripheral gate electrode which are sequentially stacked on the lower substrate 10, and forming source/drain regions by adding (e.g., injecting) dopants into the lower substrate 10 at both sides of the peripheral gate electrode. Peripheral gate spacers may be formed on both sidewalls of the peripheral gate electrode.

The lower insulating layer 50 may include a single insulating layer or a plurality of stacked insulating layers, which covers the peripheral logic circuits PTR. For example, the lower insulating layer 50 may include at least one of a silicon oxide layer, a silicon nitride layer, a silicon oxynitride layer, or a low-k dielectric layer.

The formation of the peripheral interconnection structures 31 and 33 may include forming peripheral contact plugs 31 penetrating portions of the lower insulating layer 50, and forming peripheral circuit interconnection lines 33 connected to the peripheral contact plugs 31.

A horizontal semiconductor layer 100 may be formed by depositing a semiconductor material on the lower insulating layer 50. For example, the horizontal semiconductor layer 100 may include at least one of silicon (Si), germanium (Ge), silicon-germanium (SiGe), gallium-arsenic (GaAs), indium-gallium-arsenic (InGaAs), or aluminum-gallium-arsenic (AlGaAs). The horizontal semiconductor layer 100 may include a semiconductor material doped with dopants and/or an intrinsic semiconductor material not doped with dopants. The horizontal semiconductor layer 100 may have a crystal structure including at least one of a single-crystalline structure, an amorphous structure, or a poly-crystalline structure.

A first buffer insulating layer 17 may be formed on the horizontal semiconductor layer 100, and a lower sacrificial layer LSL may be formed on the first buffer insulating layer 17. The first buffer insulating layer 17 may be formed by thermally oxidizing a surface of the horizontal semiconductor layer 100 or may be formed by depositing a silicon oxide layer.

The lower sacrificial layer LSL may be formed of a material having an etch selectivity with respect to the first buffer insulating layer 17. For example, the lower sacrificial layer LSL may be formed of at least one of a silicon nitride layer, a silicon oxynitride layer, a silicon carbide layer, or a silicon-germanium layer. The formation of the lower sacrificial layer LSL may include depositing a lower sacrificial layer on an entire top surface of the horizontal semiconductor layer 100, forming a first mask pattern (not shown) exposing portions of the deposited lower sacrificial layer, and etching the deposited lower sacrificial layer using the first mask pattern as an etch mask to expose the first buffer insulating layer 17 or the horizontal semiconductor layer 100. Thus, openings may be formed in the lower sacrificial layer LSL provided on the connection region CNR.

A second buffer insulating layer 19 and a second horizontal pattern SCP2 may be sequentially deposited with uniform thicknesses on the lower sacrificial layer LSL. The second buffer insulating layer 19 and the second horizontal pattern SCP2 may also be formed in the openings of the lower sacrificial layer LSL. In some embodiments, the second buffer insulating layer 19 may be omitted, and the second horizontal pattern SCP2 may be deposited directly on the lower sacrificial layer LSL. For example, the second buffer insulating layer 19 may be a silicon oxide layer, and the second horizontal pattern SCP2 may be a poly-silicon layer doped with N-type dopants and/or carbon (C).

Referring to FIGS. 14A and 14B, insulating layers ILD and upper sacrificial layers USL may be vertically and alternately stacked on the second horizontal pattern SCP2, thereby forming a mold structure ML. In the mold structure ML, the upper sacrificial layers USL may be formed of a material having an etch selectivity with respect to the insulating layers ILD. For example, the upper sacrificial layers USL may be formed of a different insulating material from that of the insulating layers ILD. The upper sacrificial layers USL may be formed of the same material as the lower sacrificial layer LSL. For example, each of the upper sacrificial layers USL may be formed of a silicon nitride layer, and each of the insulating layers ILD may be formed of a silicon oxide layer. Thicknesses of the upper sacrificial layers USL may be substantially equal to each other, and a thickness of at least one of the insulating layers ILD may be different from that (those) of other(s) of the insulating layers ILD.

Referring to FIGS. 15A and 15B, vertical structures VS penetrating the mold structure ML may be formed.

The formation of the vertical structures VS may include forming vertical holes vertically penetrating the mold structure ML, and forming a data storage layer and a vertical pattern VC which are sequentially stacked on an inner surface of each of the vertical holes. The data storage layer may include a tunnel insulating layer TIL, a charge storage layer CIL, and a blocking insulating layer BLK. A sum of thicknesses of the data storage layer and the vertical pattern VC on an inner sidewall of the vertical hole may be less than about a half of an upper width of the vertical hole. In other words, the data storage layer and the vertical pattern VC may define an empty space in each of the vertical holes, and the empty space may be filled with a filling insulation pattern VI.

Subsequently, a bit line conductive pad PAD may be formed on a top end of each of the vertical patterns VC. The bit line conductive pad PAD may be a dopant region doped with dopants or may be formed of a conductive material. A bottom surface of the bit line conductive pad PAD may be located at a higher level than a top surface of an uppermost one of the upper sacrificial layers USL. After the formation of the bit line conductive pads PAD, a first interlayer insulating layer 121 may be formed on the mold structure ML to cover the bit line conductive pads PAD.

Next, trenches may be formed to penetrate the first interlayer insulating layer 121 and the mold structure ML, and a preliminary sacrificial spacer layer 130$p$ may be formed in the trenches.

The formation of the trenches may include forming a mask pattern (not shown) defining planar positions of the trenches on the first interlayer insulating layer 121, and etching (e.g., anisotropically etching) the first interlayer insulating layer 121 and the mold structure ML using the mask pattern as an etch mask. Sidewalls of the upper sacrificial layers USL and sidewalls of the insulating layers ILD may be exposed by the trenches. In the anisotropic etching process for forming the trenches, the second buffer insulating layer 19 may be used as an etch stop layer and the second horizontal pattern SCP2 may also be etched. The trenches may expose portions of the second buffer insulating layer 19.

Subsequently, the preliminary sacrificial spacer layer 130p may be formed on inner surfaces of the trenches. The preliminary sacrificial spacer layer 130p may conformally cover sidewalls and bottom surfaces of the trenches. In other words, the preliminary sacrificial spacer layer 130p may cover the sidewalls of the upper sacrificial layers USL, the sidewalls of the insulating layers ILD, sidewalls of the second horizontal pattern SCP2, and a top surface of the second buffer insulating layer 19, which are exposed by the trenches. In some embodiments, the preliminary sacrificial spacer layer 130p may have a uniform thickness along the sidewalls and bottom surfaces of the trenches as illustrated in FIG. 15A. The preliminary sacrificial spacer layer 130p may be formed of a material having an etch selectivity with respect to the mold structure ML and the lower sacrificial layer LSL. For example, the preliminary sacrificial spacer layer 130p may be formed of a poly-silicon layer.

Referring to FIGS. 16A and 16B, an etching process (e.g., an anisotropic etching process) may be performed on the preliminary sacrificial spacer layer 130p to form a sacrificial spacer layer 130 covering a sidewall of each of the trenches. The second buffer insulating layer 19 under the trenches may be etched in the anisotropic etching process for forming the sacrificial spacer layer 130. Thus, the lower sacrificial layer LSL may be exposed. At this time, portions of the horizontal semiconductor layer 100 may be exposed in the openings of the lower sacrificial layer LSL.

An etching process (e.g., an isotropic etching process) may be performed on the exposed lower sacrificial layer LSL to form a horizontal recess region exposing portions of the data storage layers. During the isotropic etching process, the horizontal recess region may be formed using an etch recipe having an etch selectivity with respect to the sacrificial spacer layer 130, the first and second buffer insulating layers 17 and 19 and the data storage layer. When the lower sacrificial layer LSL includes a silicon nitride layer or a silicon oxynitride layer, the isotropic etching process performed on the lower sacrificial layer LSL may use an etching solution including phosphoric acid.

The horizontal recess region may horizontally extend from the trench into between the second horizontal pattern SCP2 and the horizontal semiconductor layer 100 and may be an empty space between the second horizontal pattern SCP2 and the horizontal semiconductor layer 100. The horizontal recess region may expose the portions of the data storage layers between the second horizontal pattern SCP2 and the horizontal semiconductor layer 100. When the horizontal recess region is formed, portions of the second horizontal pattern SCP2 in the openings of the lower sacrificial layer LSL may function as supporters supporting the mold structure ML such that the mold structure ML may not collapse.

The portions of the data storage layers exposed by the horizontal recess region may be isotropically etched to form undercut regions exposing portions of the vertical patterns VC. The undercut region may be an empty space vertically extending from the horizontal recess region and may be defined between the vertical pattern VC and a sidewall of the second horizontal pattern SCP2.

Since the isotropic etching process is performed on the data storage layer, the data storage layer may be divided into a data storage pattern and a dummy data storage pattern, which are vertically spaced apart from each other. The isotropic etching process performed on the data storage layer may use an etch recipe having an etch selectivity with respect to the horizontal semiconductor layer 100, the second horizontal pattern SCP2, the vertical pattern VC, and the sacrificial spacer layer 130.

The isotropic etching of the data storage layer may include sequentially and isotropically etching the blocking insulating layer BLK, the charge storage layer CIL and the tunnel insulating layer TIL, which are exposed by the horizontal recess region. In more detail, the isotropic etching process for forming the undercut region may include a first etching process for etching a portion of the blocking insulating layer BLK, a second etching process for etching a portion of the charge storage layer CIL, and a third etching process for etching a portion of the tunnel insulating layer TIL. The first, second and third etching processes may be sequentially performed. For example, the first and third etching processes may use an etching solution including hydrofluoric acid or sulfuric acid, and the second etching process may use an etching solution including phosphoric acid. The first and second buffer insulating layers 17 and 19 may be removed in the isotropic etching process of the data storage layer. Next, the portions of the vertical patterns VC exposed by the horizontal recess region may be removed to expose portions of the filling insulation patterns VI. In some embodiments, the process for removing the exposed portions of the vertical patterns VC may be omitted. Subsequently, an interface layer IPL may be formed on inner surfaces of the horizontal recess region and the undercut regions, as illustrated in FIG. 16C. Next, the sacrificial spacer layer 130 on the sidewall of the trench may be removed.

Figure 17B:
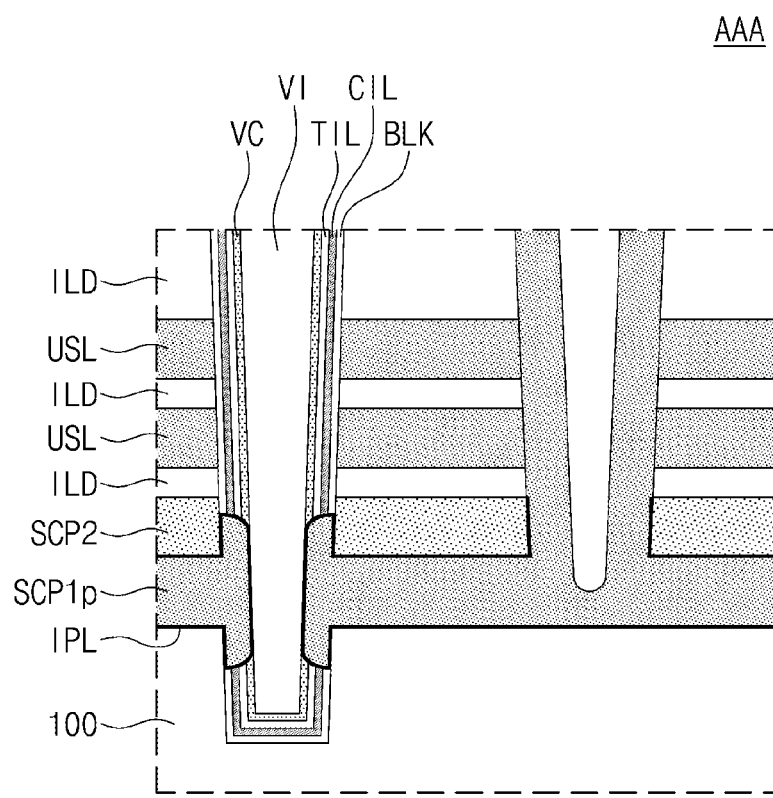

Referring to FIGS. 17A and 17B, a preliminary horizontal pattern SCP1p may be formed in the undercut regions, the horizontal recess region, and the trench. The preliminary horizontal pattern SCP1p may be formed using a chemical vapor deposition (CVD) process or an atomic layer deposition (ALD) process. The preliminary horizontal pattern SCP1p may be, for example, a semiconductor layer doped with dopants, for example, N-type dopants.

The preliminary horizontal pattern SCP1p may cover the inner surfaces of the undercut region, the horizontal recess region and the trench by the deposition process. The preliminary horizontal pattern SCP1p may not completely fill the trench and may define a gap region in the trench. The preliminary horizontal pattern SCP1p may be connected to portions of the vertical patterns VC under the second horizontal pattern SCP2 through the interface layer IPL.

In more detail, a semiconductor source gas may be supplied into the undercut region, the horizontal recess region, and the trench in the deposition process for forming the preliminary horizontal pattern SCP1p, and thus a semiconductor material may be deposited on the inner surfaces of the undercut region, the horizontal recess region and the trench.

When the preliminary horizontal pattern SCP1p is formed, a deposition rate of the semiconductor material may be changed depending on characteristics of a surface exposed by the horizontal recess region. In other words, a deposition rate of the semiconductor material on a top surface of the horizontal semiconductor layer 100 may be different from a deposition rate of the semiconductor material on a bottom surface of the second horizontal pattern SCP2. In addition, when the preliminary horizontal pattern SCP1p is formed, a crystal structure of the semiconductor material may be determined depending on a crystal structure of the surface exposed by the horizontal recess region. In some embodiments, a thickness of the semiconductor material deposited on the top surface of the horizontal semiconductor layer 100 may be less than a thickness of the semiconductor material deposited on the bottom surface of the second horizontal pattern SCP2. In some embodiments, a thickness of the semiconductor material deposited on the top surface of the horizontal semiconductor layer 100 may be substantially equal to a thickness of the semiconductor material deposited on the bottom surface of the second horizontal pattern SCP2.

Figure 18:
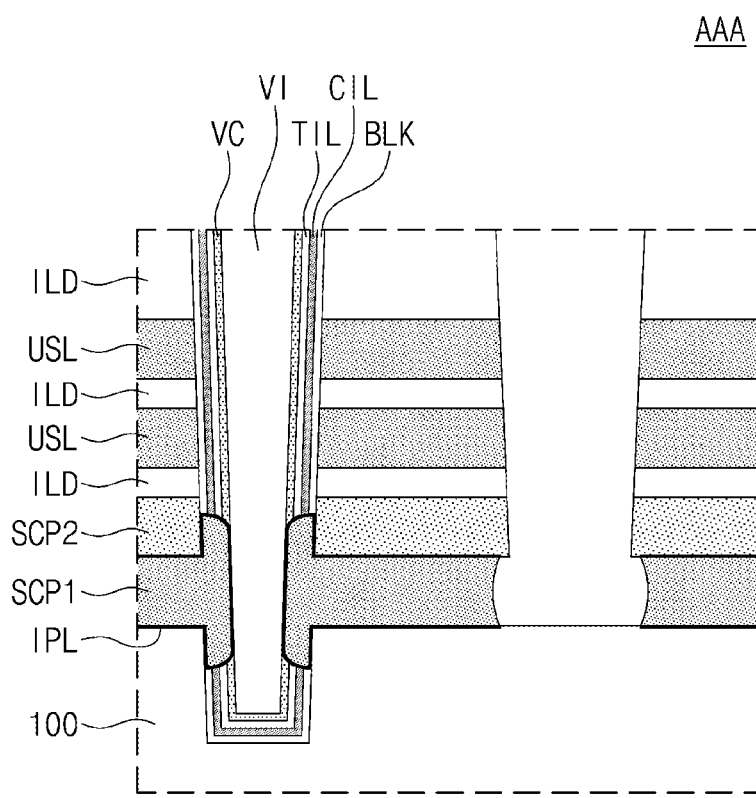
Figure 19:
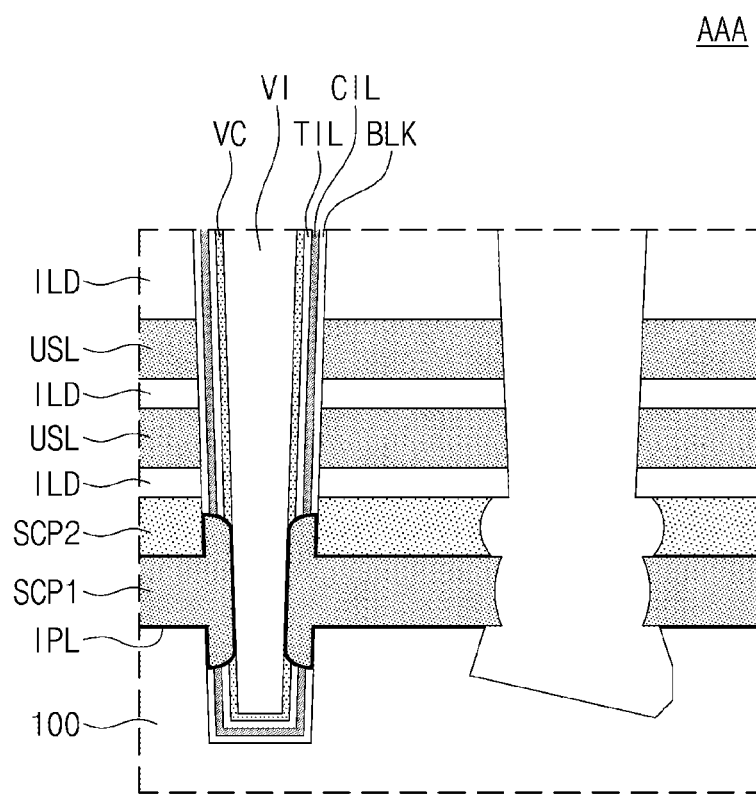

Referring to FIGS. 18 and 19, an etching process may be performed on the preliminary horizontal pattern SCP1p and the horizontal semiconductor layer 100. Thus, a first horizontal pattern SCP1 and a recess region RS may be formed. The etching process on the preliminary horizontal pattern SCP1p and the horizontal semiconductor layer 100 may be performed using an etch recipe including ADM (ammonia deionized mixture). The etching process on the preliminary horizontal pattern SCP1p and the horizontal semiconductor layer 100 may use ADM as an etchant.

Figure 20A:
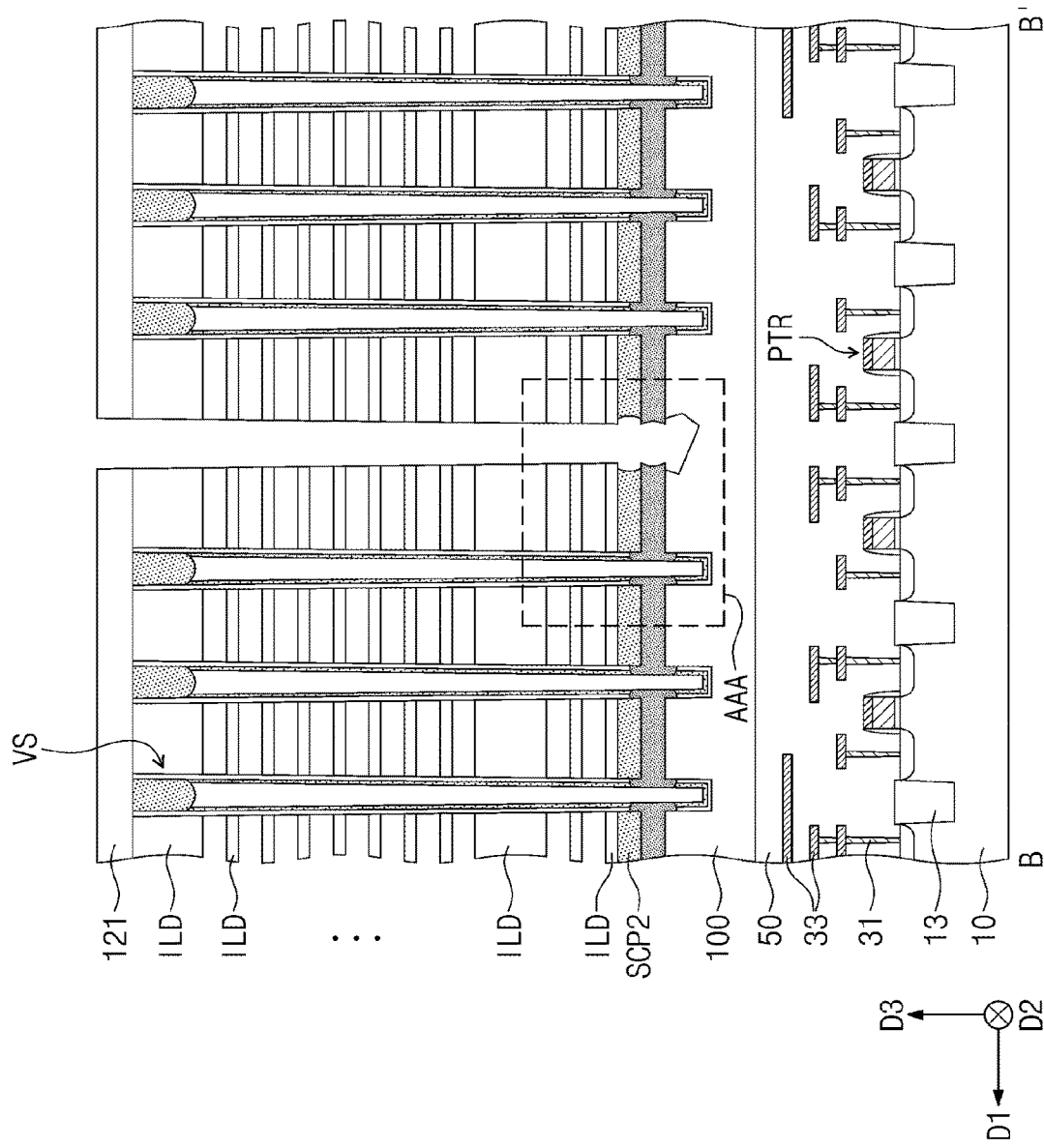
Figure 20B:
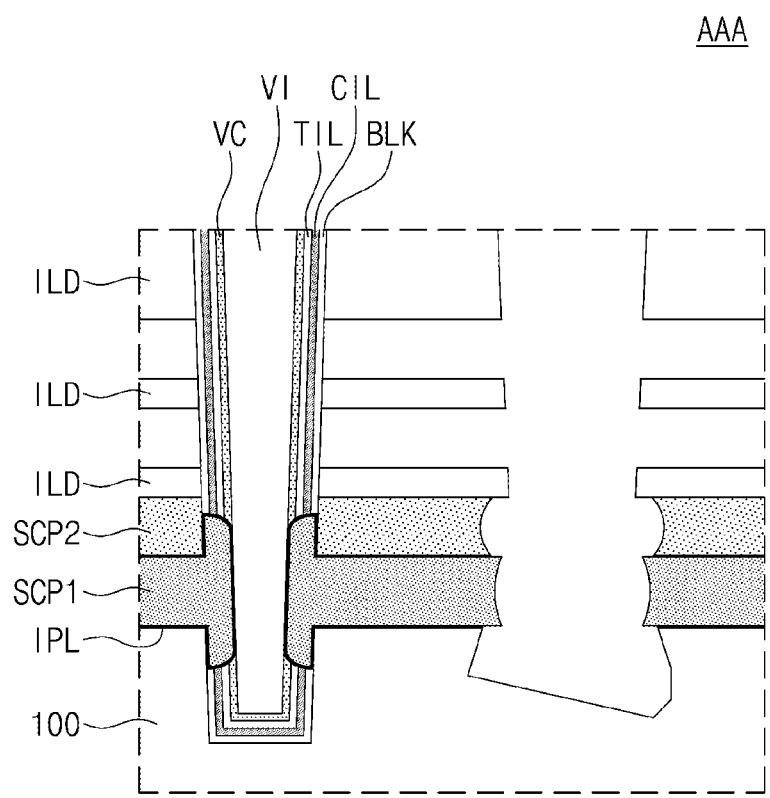
Figure 20C:
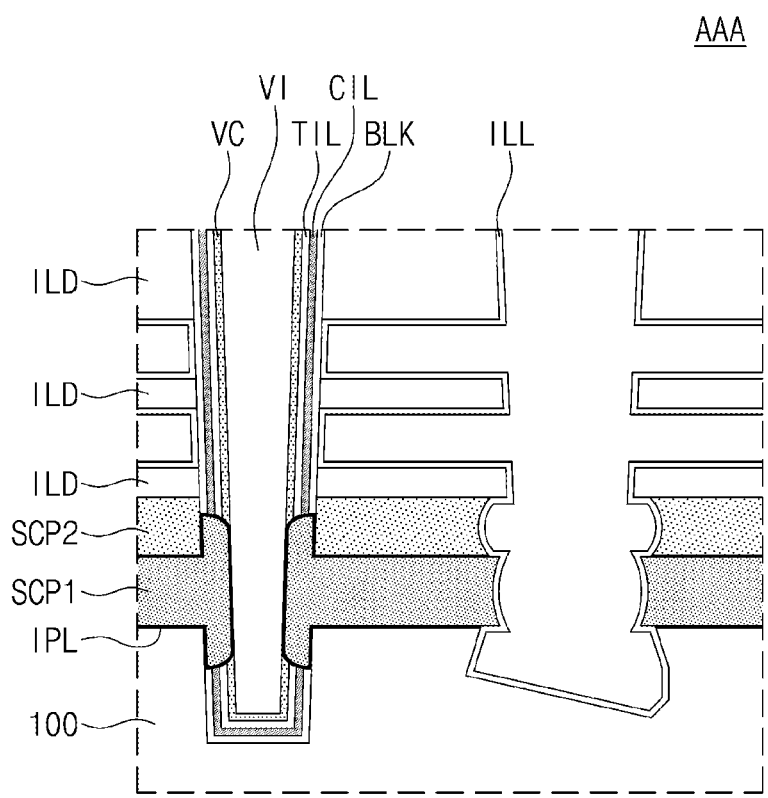

Referring to FIGS. 20A and 20B, an etching process for removing the upper sacrificial layers USL may be performed. Next, as illustrated in FIG. 20C, a first insulating layer ILL may be conformally formed in spaces formed by the removal of the upper sacrificial layers USL. In some embodiments, the first insulating layer ILL may have a uniform thickness as illustrated in FIG. 20C.

Referring again to FIGS. 3A and 3B, the stack structure ST described above may be formed by performing processes for forming electrodes EGE, GGE, CGE and SGE in the spaces formed by the removal of the upper sacrificial layers USL.

After the formation of the stack structure ST, a separation structure SS may be formed in the trench and the recess region RS. In some embodiments, the separation structure SS may include the common source plug CSP and the sidewall spacer SL, as illustrated in FIGS. 7A and 7B. In this case, the formation of the sidewall spacer SL may include depositing a spacer layer with a uniform thickness on the horizontal semiconductor layer 100 on which the stack structure ST is formed, and performing an etch-back process on the spacer layer to expose the horizontal semiconductor layer 100. Subsequently, a conductive layer may be deposited to fill the trench and the recess region RS which have the sidewall spacer SL, and then, the deposited conductive layer may be planarized until a top surface of the first interlayer insulating layer 121 is exposed, thereby forming the common source plug CSP. The common source plug CSP may be connected to the horizontal semiconductor layer 100.

Thereafter, a second interlayer insulating layer 123 may be formed on the first interlayer insulating layer 121 to cover a top surface of the separation structure SS. Bit line contact plugs BPLG may be formed to penetrate the second and first interlayer insulating layers 123 and 121. The bit line contact plugs BPLG may be connected to the bit line conductive pads PAD. The bit lines BL described above may be formed on the second interlayer insulating layer 123.

According to some embodiments of the inventive concepts, operating characteristics and reliability of the 3D semiconductor memory device may be improved, and the 3D semiconductor memory device may be easily manufactured.

While the inventive concepts have been described with reference to example embodiments, it will be apparent to those skilled in the art that various changes and modifications may be made without departing from the scopes of the inventive concepts. Therefore, it should be understood that the embodiments described herein are not limiting, but illustrative. Thus, the scopes of the inventive concepts are to be determined by the broadest permissible interpretation of the following claims and their equivalents, and shall not be restricted or limited by the foregoing description.

What is claimed is:

1. A three-dimensional (3D) semiconductor memory device comprising:
a horizontal structure on an upper surface of a substrate, the horizontal structure comprising a first horizontal pattern and a second horizontal pattern that are sequentially stacked on the upper surface of the substrate in a vertical direction;
a stack structure comprising a plurality of electrodes stacked on the horizontal structure in the vertical direction;
a vertical pattern extending through the plurality of electrodes and connected to the first horizontal pattern; and
a separation structure intersecting the stack structure and the horizontal structure and protruding into the upper surface of the substrate,
wherein a lowermost electrode of the plurality of electrodes comprises first inner sidewalls that face each other and are spaced apart from each other in a first direction with the separation structure interposed therebetween, and the second horizontal pattern comprises second inner sidewalls that face each other and are spaced apart from each other in the first direction with the separation structure interposed therebetween, and
wherein a maximum distance between the first inner sidewalls in the first direction is less than a maximum distance between the second inner sidewalls in the first direction.

2. The 3D semiconductor memory device of claim 1, wherein the vertical pattern comprises a plurality of vertical patterns, and the separation structure is between first vertical patterns of the plurality of vertical patterns and second vertical patterns of the plurality of vertical patterns and extends longitudinally in a second direction parallel to the upper surface of the substrate.

3. The 3D semiconductor memory device of claim 1, wherein the first horizontal pattern comprises third inner sidewalls that face each other and are spaced apart from each other with the separation structure interposed therebetween, and a maximum distance between the third inner sidewalls in the first direction is less than the maximum distance between the second inner sidewalls in the first direction.

4. The 3D semiconductor memory device of claim 1, wherein the first horizontal pattern comprises third inner sidewalls that face each other and are spaced apart from each other in the first direction with the separation structure interposed therebetween, and
wherein a maximum width of the separation structure in the first direction is greater than a maximum distance between the third inner sidewalls in the first direction.

5. The 3D semiconductor memory device of claim 1, wherein the separation structure has a maximum width in the first direction at a level lower, in the vertical direction, than a lower surface of the first horizontal pattern.

6. The 3D semiconductor memory device of claim 1, further comprising:
an insulating layer extending between the separation structure and one of the second inner sidewalls of the second horizontal pattern, wherein the insulating layer covers a portion of an upper surface of the first horizontal pattern.

7. The 3D semiconductor memory device of claim 1, wherein the substrate includes a recess, and a portion of the separation structure is in the recess, and
wherein a depth of the recess in the vertical direction is greater than a thickness of the first horizontal pattern in the vertical direction.

8. The 3D semiconductor memory device of claim 1, wherein the first horizontal pattern comprises an upper surface that comprises a first portion facing the second horizontal pattern and a second portion protruding toward the separation structure beyond one of the second inner sidewalls of the second horizontal pattern such that the second horizontal pattern does not overlap the second portion of the upper surface of the first horizontal pattern in the vertical direction.

9. The 3D semiconductor memory device of claim 8, further comprising an interface layer between the first horizontal pattern and the second horizontal pattern,
wherein the interface layer comprises carbon (C) or a conductive material, and
wherein the interface layer does not overlap the second portion of the upper surface of the first horizontal pattern in the vertical direction.

10. A three-dimensional (3D) semiconductor memory device comprising:
a substrate, an upper surface of the substrate comprising a recess;
a stack structure comprising a plurality of electrodes stacked on the upper surface of the substrate in a vertical direction;
a horizontal structure between the stack structure and the substrate, the horizontal structure comprising a first horizontal pattern and a second horizontal pattern that are sequentially stacked on the upper surface of the substrate in the vertical direction; and
a separation structure intersecting the stack structure and the horizontal structure in a first direction parallel to the upper surface of the substrate, a portion of the separation structure being in the recess of the substrate,
wherein the first horizontal pattern comprises first inner sidewalls that face each other and are spaced apart from each other in a second direction that is perpendicular to the first direction with the separation structure interposed therebetween, and
wherein a maximum width of the recess in the second direction is greater than a maximum distance between the first inner sidewalls in the second direction.

11. The 3D semiconductor memory device of claim 10, further comprising:
a plurality of vertical patterns extending through the plurality of electrodes and connected to the first horizontal pattern,
wherein the separation structure is between first vertical patterns of the plurality of vertical patterns and second vertical patterns of the plurality of vertical patterns.

12. The 3D semiconductor memory device of claim 10, wherein the portion of the separation structure in the recess is overlapped in the vertical direction by a lowermost electrode of the plurality of electrodes.

13. The 3D semiconductor memory device of claim 10, wherein the second horizontal pattern comprises second inner sidewalls that face each other and are spaced apart from each other in the second direction with the separation structure interposed therebetween, and
wherein a maximum distance between the second inner sidewalls in the second direction is greater than the maximum distance between the first inner sidewalls in the second direction.

14. The 3D semiconductor memory device of claim 10, further comprising:
an interface layer extending between the first horizontal pattern and the second horizontal pattern and including carbon (C).

15. The 3D semiconductor memory device of claim 10, wherein the first horizontal pattern comprises a lower surface that comprises a first portion facing the substrate and a second portion protruding toward the separation structure beyond a sidewall of the recess.

16. A three-dimensional (3D) semiconductor memory device comprising:
peripheral logic circuits on a lower substrate;
a lower insulating layer on the peripheral logic circuits;
a substrate on the lower insulating layer, an upper surface of the substrate comprising a recess;
a stack structure comprising a plurality of electrodes vertically stacked on the upper surface of the substrate;
a horizontal structure between the stack structure and the substrate, the horizontal structure comprising a first horizontal pattern and a second horizontal pattern that are sequentially stacked on the upper surface of the substrate;
a vertical pattern extending through the plurality of electrodes and connected to the first horizontal pattern;
a separation structure intersecting the stack structure and the horizontal structure in a first direction parallel to the upper surface of the substrate, a portion of the separation structure being in the recess of the substrate;
an interface layer between the first horizontal pattern and the second horizontal pattern; and
a first insulating layer between the substrate and the separation structure in the recess of the substrate,
wherein the interface layer extends on a first portion of an upper surface of the first horizontal pattern, and the first insulating layer extends on a second portion of the upper surface of the first horizontal pattern.

17. The 3D semiconductor memory device of claim 16, wherein the interface layer extends on a first portion of a lower surface of the first horizontal pattern, and the first insulating layer extends on a second portion of the lower surface of the first horizontal pattern.

18. The 3D semiconductor memory device of claim 16, wherein the first horizontal pattern comprises first inner sidewalls that face each other with the separation structure interposed therebetween, and
wherein the interface layer is in direct contact with the first insulating layer.

19. The 3D semiconductor memory device of claim 16, wherein the first horizontal pattern comprises first inner sidewalls facing each other with the separation structure interposed therebetween, and
wherein the interface layer does not cover the first inner sidewalls.

20. The 3D semiconductor memory device of claim 16, further comprising:

a through-interconnection structure comprising a through-insulating pattern vertically extending through the stack structure and a through-plug vertically extending through the through-insulating pattern so as to be connected to the peripheral logic circuits.

* * * * *